(12) United States Patent
Zhuang et al.

(10) Patent No.: US 8,204,107 B2
(45) Date of Patent: Jun. 19, 2012

(54) BANDWIDTH REDUCTION MECHANISM FOR POLAR MODULATION

(75) Inventors: Jingcheng Zhuang, Allen, TX (US); Robert B. Staszewski, Garland, TX (US); Khurram Waheed, Plano, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 647 days.

(21) Appl. No.: 12/324,308

(22) Filed: Nov. 26, 2008

(65) Prior Publication Data

US 2009/0258612 A1  Oct. 15, 2009

Related U.S. Application Data

(60) Provisional application No. 61/043,432, filed on Apr. 9, 2008.

(51) Int. Cl.
*H04B 1/66* (2006.01)
(52) U.S. Cl. ...................................... 375/240; 375/295
(58) Field of Classification Search .................. 375/295, 375/260, 296, 297, 240
See application file for complete search history.

(56) References Cited

U.S. PATENT DOCUMENTS

| | | | |
|---|---|---|---|
| 5,990,738 A * | 11/1999 | Wright et al. | 330/149 |
| 6,809,598 B1 | 10/2004 | Staszewski et al. | |
| 7,068,984 B2 * | 6/2006 | Mathe et al. | 455/126 |
| 7,839,954 B1 * | 11/2010 | Lee | 375/302 |
| 2002/0193085 A1* | 12/2002 | Mathe et al. | 455/126 |
| 2003/0012289 A1* | 1/2003 | Lindoff | 375/262 |
| 2003/0021357 A1* | 1/2003 | Korol et al. | 375/295 |
| 2006/0033582 A1 | 2/2006 | Staszewski et al. | |
| 2006/0038710 A1 | 2/2006 | Staszewski et al. | |
| 2008/0002788 A1 | 1/2008 | Akhtar et al. | |
| 2008/0304594 A1* | 12/2008 | Schell et al. | 375/300 |

* cited by examiner

*Primary Examiner* — Emmanuel Bayard
(74) *Attorney, Agent, or Firm* — Wade J. Brady, III; Frederick J. Telecky, Jr.

(57) ABSTRACT

A novel and useful apparatus for and method of reducing phase and amplitude modulation bandwidth in polar transmitters. The bandwidth reduction mechanism of the present invention effectively reduces the phase modulation bandwidth of the polar modulation performed in the transmitter by modifying the zero-crossing trajectories in the IQ domain. This significantly reduces the phase modulation bandwidth while still meeting the output spectrum and error vector magnitude (EVM) requirements of the particular modern wideband wireless standard, such as 3G WCDMA, etc. The mechanism detects a zero crossing or a near zero crossing within a predetermined threshold of the origin and an offset vector is generated that when added to the input TX IQ data, shifts the trajectory to avoid the origin thus reducing the resultant polar modulation amplitude and phase bandwidth.

13 Claims, 26 Drawing Sheets

BANDWIDTH REDUCTION MECHANISM FOR POLAR MODULATION

REFERENCE TO PRIORITY APPLICATION

This application claims priority to U.S. Provisional Application Ser. No. 61/043,432, filed Apr. 9, 2008, entitled "Bandwidth Reduction Technique for Polar Modulation," incorporated herein by reference in its entirety.

FIELD OF THE INVENTION

The present invention relates to the field of data communications and more particularly relates to an apparatus for and method of reducing phase and amplitude modulation bandwidth in polar transmitters.

BACKGROUND OF THE INVENTION

With the explosive growth of the cellular phone industry, the need has arisen to reduce cost and power consumption of mobile handsets. To keep costs down, the entire radio, including memory, application processor, digital baseband processor, analog baseband and RF circuits, would ideally be all integrated onto a single silicon die with a minimal count of external components. The use of low-voltage deep submicron CMOS processes allows for an unprecedented degree of scaling and integration in digital circuitry, but complicates implementation of traditional RF circuits. Furthermore, any mask adders for RF/analog circuits are not acceptable from a fabrication cost standpoint.

Consequently, a strong incentive has arisen to find digital architectural solutions to the RF functions. Areas currently in focus are phase/frequency and amplitude modulations of an RF carrier realized using a digitally-controlled oscillator (DCO) and a digitally-controlled power amplifier (DPA) circuits, respectively. They are digitally-intensive equivalents of the conventional voltage-controlled oscillator (VCO) and power amplifier (PA) driver circuits. Due to the fine feature size and high switching speed of the modern CMOS technology, the respective digital-to-frequency conversion (DFC) and digital-to-RF-amplitude conversion (DRAC) transfer functions could be made very linear and of high dynamic range.

A block diagram illustrating an example prior art polar transmitter is shown in FIG. 1. The polar transmitter, generally referenced 10, comprises CORDIC and polar signal processing block 12, digital to frequency conversion block (DFC) 14 and Digital to RF amplitude conversion block (DRAC) 16. The DFC 14 comprises a modulator 22 and digitally controlled oscillator (DCO) 24. The DRAC 16 comprises a modulator 18 and digital power amplifier (DPA) 20.

The I and Q samples of the Cartesian coordinate system generated in a digital baseband (DBB) are converted through CORDIC algorithm 12 into amplitude and phase samples of the polar coordinate system. The phase is then differentiated to obtain frequency deviation. The polar signals are then conditioned through signal processing to sufficiently increase the sampling rate in order to reduce the quantization noise density and lessen the effects of the modulating spectrum replicas. The frequency deviation output signal is fed into the DCO based DFC 14, which produces a phase modulated (PM) digital carrier $$y_{PM}(t) = sgn(\cos(\omega_0 t + \theta[k])) \quad (1)$$

where sgn(x)=1 for x≧0;
sgn(x)=−1 for x<0;
$\omega_0 = 2\pi f_0$ is the angular RF carrier frequency;
$\theta[k]$ is the modulating baseband phase of the $k^{th}$ sample.

The phase $$\theta(t) = \int_{-\infty}^{t} f(t)\,dt$$

is an integral of frequency deviation, where $t = k \cdot T_0$ with $T_0$ being the sampling period.

The amplitude modulation (AM) signal controls the envelope of the phase-modulated carrier by means of the DPA based DRAC 16. Higher-order harmonics of the digital carrier are filtered out by a matching network so that the sgn( ) operator is dropped. The composite DPA output comprises the desired RF output spectrum.

$$y_{RF}(t) = a[k] \cdot \cos(\omega_0 t + \theta[k]) \quad (2)$$

where, $a[k]$ is the modulating baseband amplitude of the $k^{th}$ sample.

While digital polar modulated transmitters have been demonstrated for GSM, GPRS, EDGE (GGE), their usage for 3G (WCDMA) and other wideband wireless standards remains a daunting task. Polar modulation relies on splitting the digital IQ baseband signal into a phase (i.e. frequency) and amplitude data stream. The phase signal θ (or differentiated phase signal (f=Δθ/Δt)) is used to directly modulate a digitally controlled oscillator (DCO), the output of which is then combined with the amplitude signal ρ in a Digital Power Amplifier (DPA). The θ (or f=Δθ/Δt) component generated when passing the 3.96 MHz WCDMA IQ signal through a CORDIC spreads significantly due to the nonlinear (i.e. arctan) operation. The resulting signal is no longer band limited and thus theoretically infinite modulation of the oscillator is needed to represent this phase signal. Although, in a discrete time system such as this, the maximum frequency deviation (Δf) will be limited to the sampling rate, it is still in the order of tens of MHz as shown in FIG. 2. Any truncation in phase data will degrade EVM. Tight modulation resolution has to be maintained in order to keep the frequency quantization noise much lower than electronic DCO phase noise.

Statistically, it can be shown that most of this signal can be represented in a bandwidth that is 10 times the signal bandwidth. This bandwidth, however, might be too large for a single oscillator (i.e. the DCO) to handle while still providing the needed granularity (i.e. quantization step size, phase noise, etc.) and frequency coverage to span all frequency bands, including the typical bands of GSM-EU, GSM-US, PCS, DCS and IMT2K. Since the DCO modulation range is limited, frequency data is truncated resulting in a severely degraded error vector magnitude (EVM).

This is further exacerbated by the fact that the DCO typically operates at 2× (for high frequency bands) or 4× (for low frequency bands) the actual desired output channel frequency. This implies that the DCO modulation range must be at least 4× the needed range. In practice, however, the modulation range must be even greater in order to compensate for coarse tuning step size, process, voltage and temperature (PVT) variations, etc.

Since the bandwidth requirements for existing GGE (i.e. 2 G and 2.5 G) polar transmitters are much smaller than that required for WCDMA and can thus be easily handled by the DCO. Therefore, one possible solution to the bandwidth problem described above, is to use multiple DCO circuits, one for each frequency band, corresponding to four DCO circuits. A disadvantage of this solution is that since the DCO circuit incorporates a large monolithic inductor, significant area would be consumed. Even if such a solution was constructed, it is not certain whether (1) the full modulation range (i.e. fine frequency step) could be achieved while keeping the DCO phase noise within specification or (2) whether the EVM would be degraded and compromised.

Generally, a polar modulator exhibits lower noise than a Cartesian modulator. In a polar modulator, the baseband IQ data is converted to a polar representation consisting of amplitude and phase. In such a conversion, the limited bandwidth IQ data may result in an infinite (or very large) bandwidth of the resulting phase as the IQ trajectory passes through or very close to the origin, which is the case in WCDMA modulation, for example.

A plot illustrating the IQ data sample constellation at the chip rate at the input to the TX signal processing path is shown in FIG. 3. Note that there is no chip value at zero. In addition, the constellation resembles the constellation for 8-PSK modulation. The lines indicate the connecting lines between each chip. A plot illustrating example IQ upsampled data as generated in the DTX path is shown in FIG. 4. Note that virtually all the data samples points are not at or near the origin. A graph illustrating the same IQ data as in FIG. 4 but with lines enabled showing the transition trajectory between IQ samples is shown in FIG. 5. In this plot, however, the trajectory of the IQ data samples does cross the origin as indicated by the large number of transitions through or near the origin. It is these zero crossing transitions which cause an increase in the modulation bandwidth. Such a high (possibly infinite) phase bandwidth makes it difficult and impractical to implement a polar modulator because it requires a very fast change of the oscillator phase (i.e. very wide frequency modulation of the oscillator).

Another prior art solution for reducing the phase modulation bandwidth is to use a LO exception handling mechanism such as shown in FIG. 6. A detailed description of the exception handling mechanism can be found in U.S. Publication No. 2006/0038710, to Staszewski et al., entitled "Hybrid Polar/Cartesian Digital Modulator" and in U.S. Publication No. 2008/0002788, to Akhtar et al., entitled "Local Oscillator Incorporating Phase Command Exception Handling Utilizing A Quadrature Switch," both of which are incorporated herein by reference in their entirety.

Although the frequency control of the DCO 24 (FIG. 1) for polar modulation is extremely precise, practically it has a limited range of perhaps 10 MHz. This is disadvantageous when, during the complex modulation, the I/Q vector is close to the origin (i.e. small amplitude) and makes fast, large phase/frequency changes, such as indicated by the example trajectories in FIG. 5 as it passes near and through the origin, versus small phase/frequency changes which occur relatively far from the origin. The frequency deviation Δf requirements for WCDMA, for example, are relatively high. Unlike with EDGE, where the data rate is approximately 270 ksymbols/sec, the data rate and bandwidth in WCDMA are an order of magnitude higher. A polar architecture that may be suitable for EDGE transmission may not be readily used for certain modulation schemes such as those used in WCDMA and WLAN transmission because the modulation data rate is very high in these schemes with the resultant difficulty of performing high frequency modulation of the DCO and the amplitude.

Digital I/Q modulation, on the other hand, has the same disadvantages of the amplitude modulation part of polar transmission, and has I and Q summed together without the benefits of the fine frequency resolution of the polar modulator. Consequently, a quadrature structure of comparable resolution would be noisier. Additionally, the phase and amplitude mismatch of the I and Q paths can result in a severe distortion of the modulated signal when the two paths are finally recombined. In that sense, the polar structure is advantageous as it is insensitive to gain inaccuracies in the amplitude path and relatively easily achieves high accuracy in the phase/frequency path. The advantages of frequency modulation, namely a very fine step size of frequency control, however, becomes a disadvantage in cases where large frequency deviations are required to be performed (see FIG. 2).

A Cartesian modulator, however, operates in the I/Q domain and can change phase instantly (e.g., within one clock cycle), so it does not suffer this limitation. Note that with digital I/Q modulation, the I and Q quadrature components are regulated digitally in an open loop system and thus typically suffer dynamic-range/accuracy limitations. This limits the accuracy in the phase domain compared to what is achievable in a polar structure where a closed loop system is used to achieve very fine frequency resolution.

The prior art structure of FIG. 6 combines the advantages of both polar and Cartesian modulation structures and avoids their disadvantages. The technique utilizes a combination of an all digital phase locked loop (ADPLL) that features a wideband frequency modulation capability and a digitally controlled power amplifier (DPA) performs interpolation between 90 degree spaced quadrature phases. In operation, the phase can be changed by a multiple of 90 degrees within one clock cycle depending on the instantaneous value of the phase change. An alternative to monitoring the large instantaneous frequency deviation is to examine the small instantaneous amplitude value, since they are highly correlated. These two statistics, however, require conversion of the quadrature I/Q signals to the polar ρ/θ domain. A simple ABS(I)+ABS(Q) metric will also work well as a proxy for the amplitude and frequency deviation.

Referring to FIG. 6, the circuit, generally referenced 170, comprises an exception handler block 172, DCO 174, quadrature divide by two/four 176 and quadrature switch or multiplexer 180. In operation, the oscillator tuning word (OTW) (or frequency tuning word (FTW)) is input to the exception handler 172. The exception handler either passes the OTW through to the DCO or replaces it with a residue tuning command. The DCO generates an RF signal having a frequency in accordance with the output of the exception handler. Normally, the quad band DCO is modulated by the oscillator tuning word data stream to generate the phase (frequency) information for the DPA. In this case, however, the OTW is input to the exception handler and the output of the exception handler is used to modulate the DCO. The DCO operates at twice (IMT2K, PCS, DCS) or four times (US-cellular, EU-cellular) the band frequency. This provides the needed tuning range to permit a single oscillator span all bands while providing acceptable phase noise. The output of the DCO is passed through a quadrature generating divider 176. Typical differential dividers provide a quadrature output by default wherein only a single phase pair is (i.e. 0 and 180 degrees) is sent to the next stage (i.e. the digital pre-power amplifier or DPA).

The frequency divider is operative to output four quadrature phases. The four phases may comprise any desired phases, 0, 45, 90, etc. Here, the four phase comprise 0/180 degrees (I+/I−) and 90/270 degrees (Q+/Q−). These four outputs of the divider are input to a fast quadrature switch that functions to select between four different quadrature phase pairs based on a switch control signal 182 generated and output of the exception handler 172. The four phase pairs comprise 0/180 degrees (I+/I−), 180/0 degrees (I−/I+), 90/270 degrees (Q+/Q−) and 270/90 degrees (Q−/Q+).

The switch is implemented by passing all four quadrature outputs of the divider through four switched inverter buffers in pairs that are 180 degrees out of phase with each other. Any phase combination can then be selected by either turning on or off any two of the inverter pairs. When the DCO is commanded to modulate beyond its range (as a result of the incoming WCDMA phase data stream), the quadrature switch is enabled and a discrete jump in phase (referred to as a phase jump) is activated.

The remaining phase modulation is referred to as the residue (or correction) phase modulation and is defined as the difference between the requested phase (e.g., OTW or FTW) and the phase jump (e.g., 90 degrees). This residue phase modulation constitutes the modified or new frequency command that is input to the DCO. The phase jump combined with the residue phase command (or correction), effectively results in the original frequency request (OTW or FTW). In addition, both the phase jump and the residue correction occur and are applied simultaneously thus resulting in the signal output of the quadrature switch to contain the full requested phase modulation. Thus, the error vector magnitude (EVM) specification is met and not degraded.

A limitation with using an analog quad-switch at the output of the DCO to achieve fast phase modulation is that the analog quad-switch can only achieve +/−90 to +/−180 degree phase jumps. Thus, any residue phase must be compensated with the DCO frequency modulation, which suffers from phase discontinuity and excessive phase noise. A graph illustrating the phase discontinuity resulting from the use of the prior art local oscillator exception handling mechanism of FIG. 6 is shown in FIG. 7 wherein trace 196 represents the reference signal and trace 194 represents the signal resulting from the prior art local oscillator exception handling mechanism. In addition, the analog quad-switch also requires calibration and compensation so that the switching control can be matched with the frequency modulation.

It is thus desirable to have a mechanism that overcomes the disadvantage of the prior art techniques. The mechanism should preferably be implementable as a simple, all digital implementation and be capable of enabling a polar transmitter to be used with wideband modulation schemes. More specifically, the mechanism should enable an oscillator having a limited bandwidth to be used with large modulation ranges required by wideband modulation schemes such as 3G WCDMA.

SUMMARY OF THE INVENTION

The present invention is a novel and useful apparatus for and method of reducing phase and amplitude modulation bandwidth in polar transmitters. The bandwidth reduction mechanism of the present invention effectively reduces the phase modulation bandwidth of the polar modulation performed in the transmitter by modifying the zero-crossing trajectories in the IQ domain. This significantly reduces the phase modulation bandwidth while still meeting the output spectrum and error vector magnitude (EVM) requirements of the particular modern wideband wireless standard, such as 3G WCDMA, etc.

The bandwidth reduction mechanism described herein is suitable for use in any application employing polar modulation that requires the generation of a wideband signal from an oscillator having a limited modulation range. An example application is provided of a single chip radio, e.g., WCDMA, etc., that integrates the RF circuitry with the digital base band (DBB) circuitry on the same die.

In operation, the bandwidth reduction mechanism is operative to detect a zero crossing or a near zero crossing within a predetermined threshold of the origin. In response, an offset vector having a magnitude and direction is generated that when added to the input TX IQ data, shifts the trajectory to avoid the origin thus reducing the resultant polar modulation phase bandwidth.

The bandwidth reduction mechanism of the invention is a fully digital solution and requires no calibration or compensation step. It exhibits very good phase noise performance (i.e. no extra phase noise introduced) and it also provides a continuous trade off between the phase modulation bandwidth, the EVM and the phase noise performance.

Several advantages of the bandwidth reduction mechanism of the present invention include (1) the mechanism does not add any additional phase discontinuity; (2) the mechanism does not require calibration or compensation; (3) the mechanism can be implemented entirely digitally (i.e. no analog constraints), and its performance is entirely predictable; (4) the mechanism provides a trade-off between the frequency modulation range, the EVM and the phase noise performance; and (5) the mechanism requires negligible chip area and exhibits very low power consumption.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application. Specific Integrated Circuit (ASIC) or Field Programmable Gate Array (FPGA), or as functionally equivalent discrete hardware components.

There is thus provided in accordance with the invention, a method of bandwidth reduction for use in a polar modulator, the method comprising the steps of determining a complex plane trajectory of input TX IQ data samples and modifying the complex plane trajectory if the complex plane trajectory passes within a predetermined threshold distance from an origin such that the bandwidth of the phase component of the modified trajectory is reduced.

There is also provided in accordance with the invention, a method of reducing polar modulation bandwidth, the method comprising the steps of receiving TX IQ data samples, converting the TX IQ data samples into amplitude samples and phase/frequency samples, detecting a distance to an origin of complex domain trajectory of the amplitude samples and phase/frequency samples and modifying the complex domain trajectory if the distance to the origin is less than a predetermined threshold distance.

There is further provided in accordance with the invention, an apparatus for reducing polar modulation bandwidth comprising a zero crossing detector operative to determine a complex domain trajectory of input TX IQ data samples and to detect the passing of the complex domain trajectory within a predetermined threshold distance from an origin and a path modification circuit operative to modify the complex domain trajectory in response to the detection so as to reduce the modulation bandwidth thereby.

There is also provided in accordance with the invention, an apparatus for reducing the bandwidth of a polar modulator comprising a filter for generating trajectory sample points, a zero crossing detector operative to determine a complex domain trajectory of input TX IQ data samples and to detect the passing of the complex domain trajectory within a predetermined threshold distance from an origin and an offset vector generator operative to generate an offset vector which, when added to the TX IQ data samples, maintains the complex domain trajectory beyond the predetermined threshold distance from the origin thereby reducing the polar modulation bandwidth.

There is further provided in accordance with the invention, a polar radio frequency (RF) transmitter comprising a bandwidth reduction circuit comprising a filter for generating trajectory sample points, a zero crossing detector operative to determine a complex domain trajectory of input TX IQ data samples and to detect the passing of the complex domain trajectory within a predetermined threshold distance from an origin, an offset vector generator operative to generate an offset vector which, when added to the TX IQ data samples, maintains the complex domain trajectory beyond the predetermined threshold distance from the origin thereby reducing the polar modulation bandwidth, a combiner for adding the offset vector to the TX IQ data samples to generate modified TX IQ data samples thereby, means for generating a frequency command and an amplitude command in accordance with the modified TX IQ data samples, a frequency synthesizer operative to generate an RF signal having a frequency in accordance with a frequency reference input and the frequency command and a digital power amplifier (DPA) operative to receive the RF signal and to generate a modulated RF output signal in proportion to the amplitude command.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
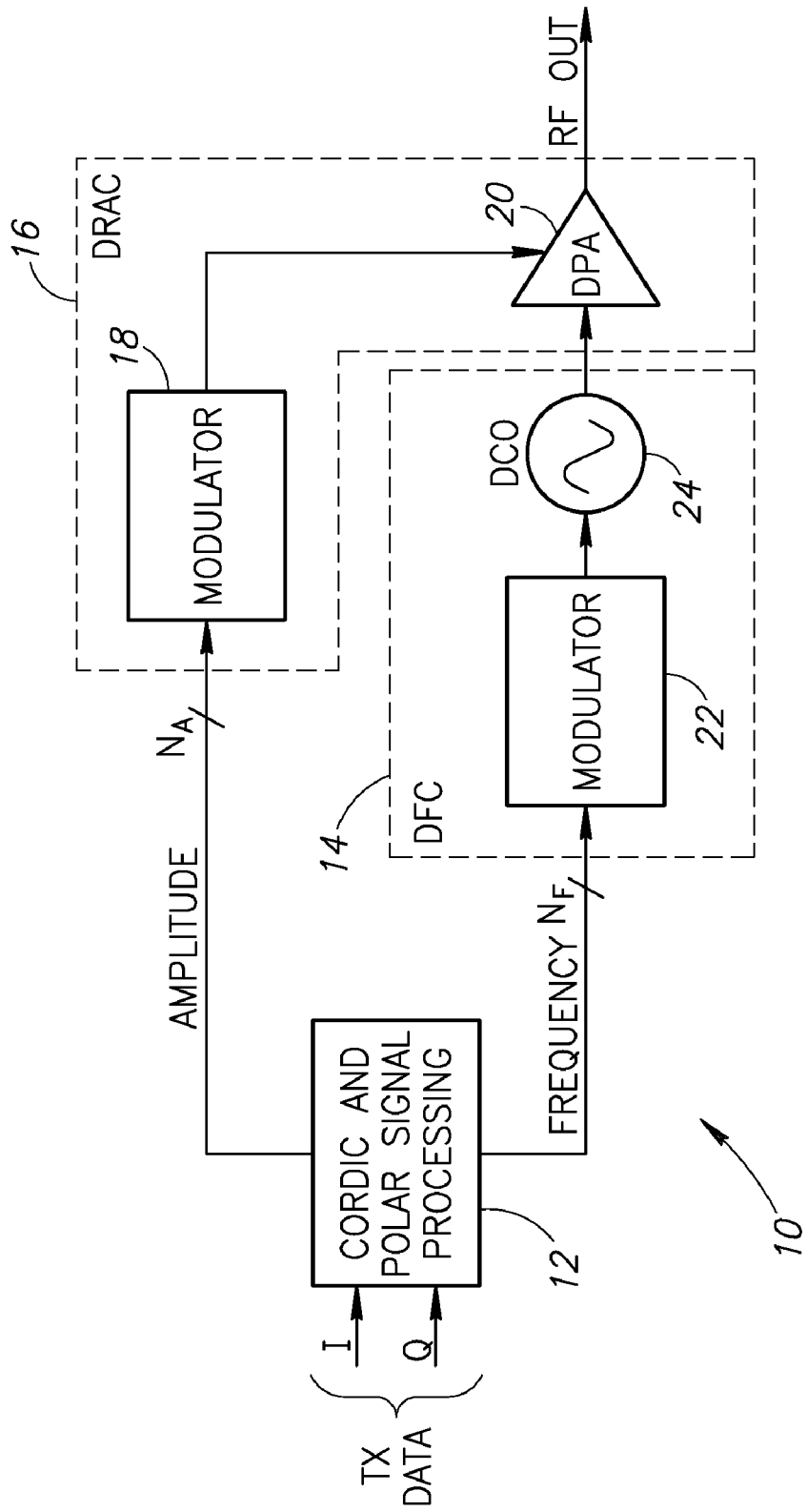
FIG. 1 is a block diagram illustrating an example prior art digital polar transmitter.
Figure 2:
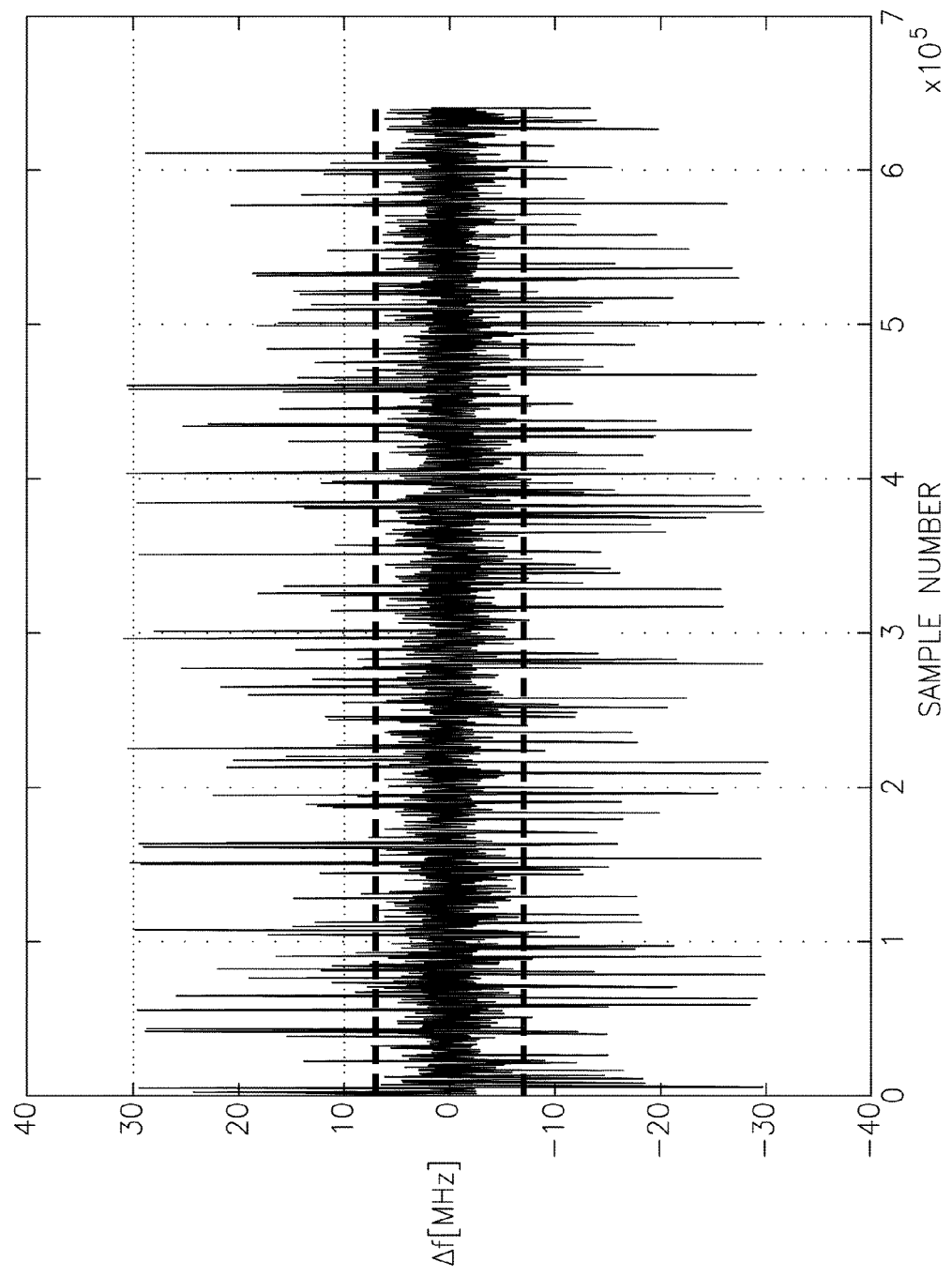
FIG. 2 is a graph illustrating the frequency deviation of a typical WCDMA modulation.
Figure 3:
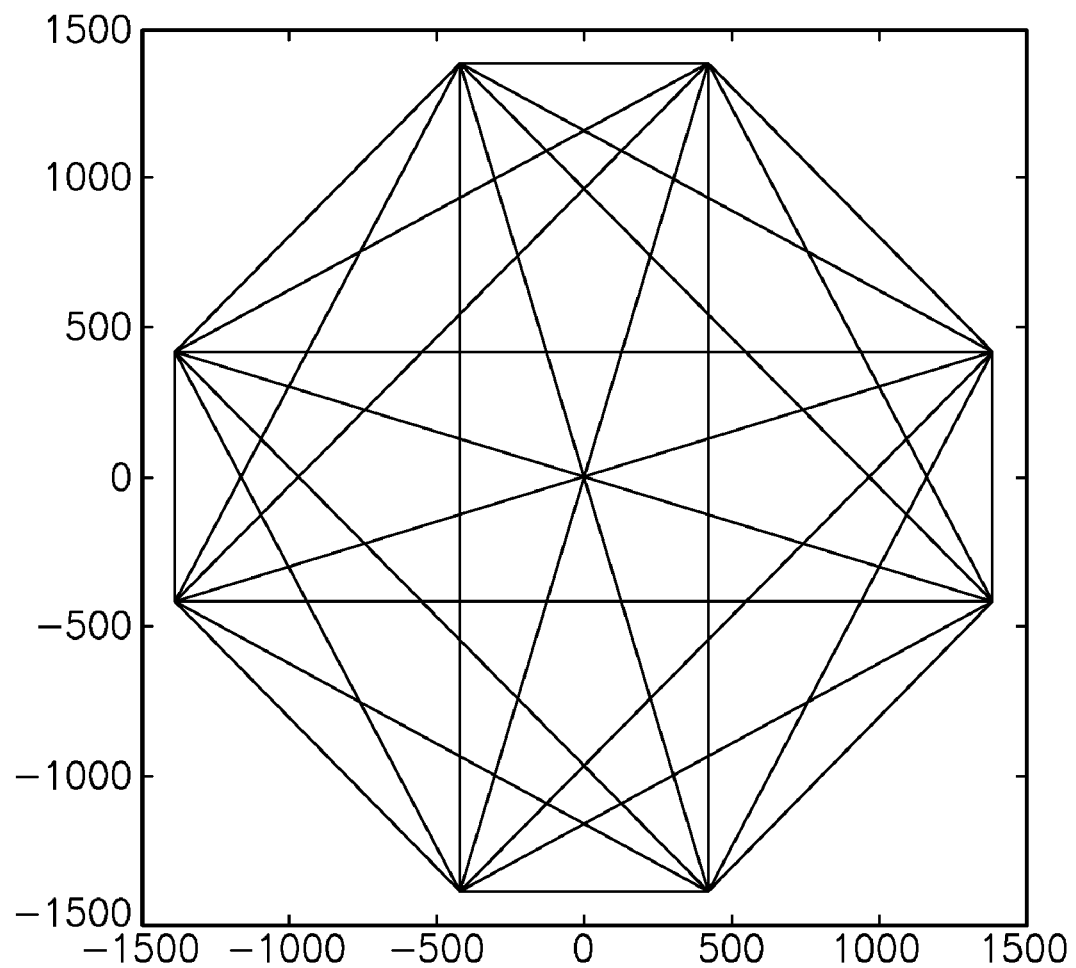
FIG. 3 is a plot illustrating the IQ data sample constellation at the chip rate at the input to the TX signal processing path.
Figure 4:
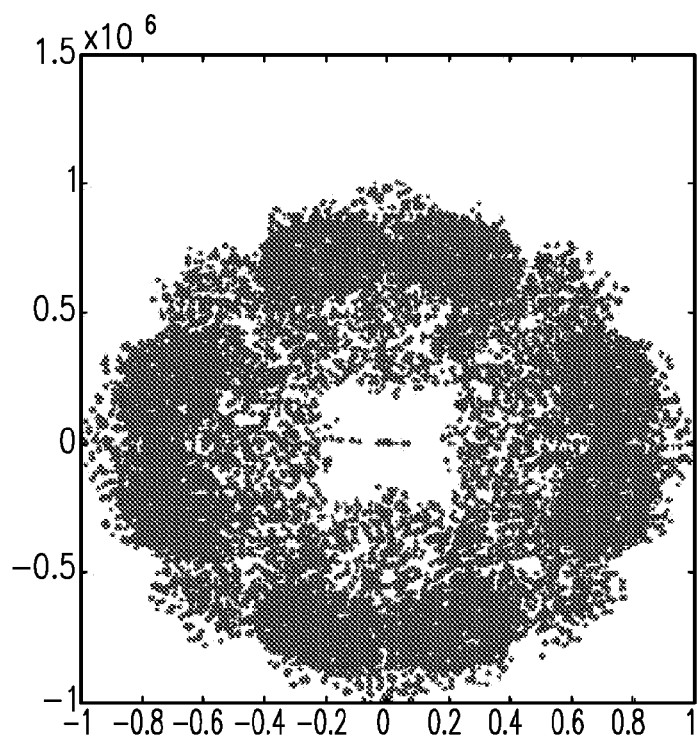
FIG. 4 is a plot illustrating IQ upsampled and filtered data as generated in the DTX path.
Figure 5:
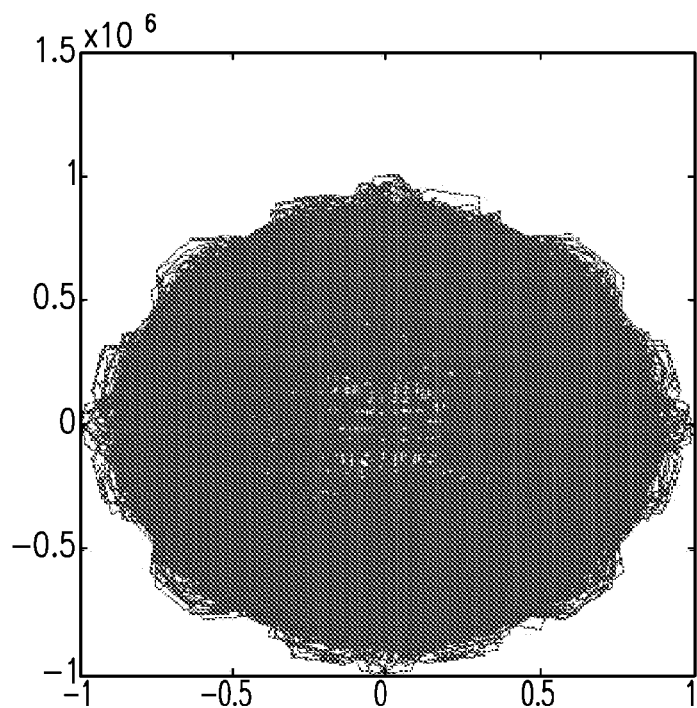
FIG. 5 is a graph illustrating the same IQ data as in FIG. 4 but with lines enabled showing the transition trajectory between IQ samples.
Figure 6:
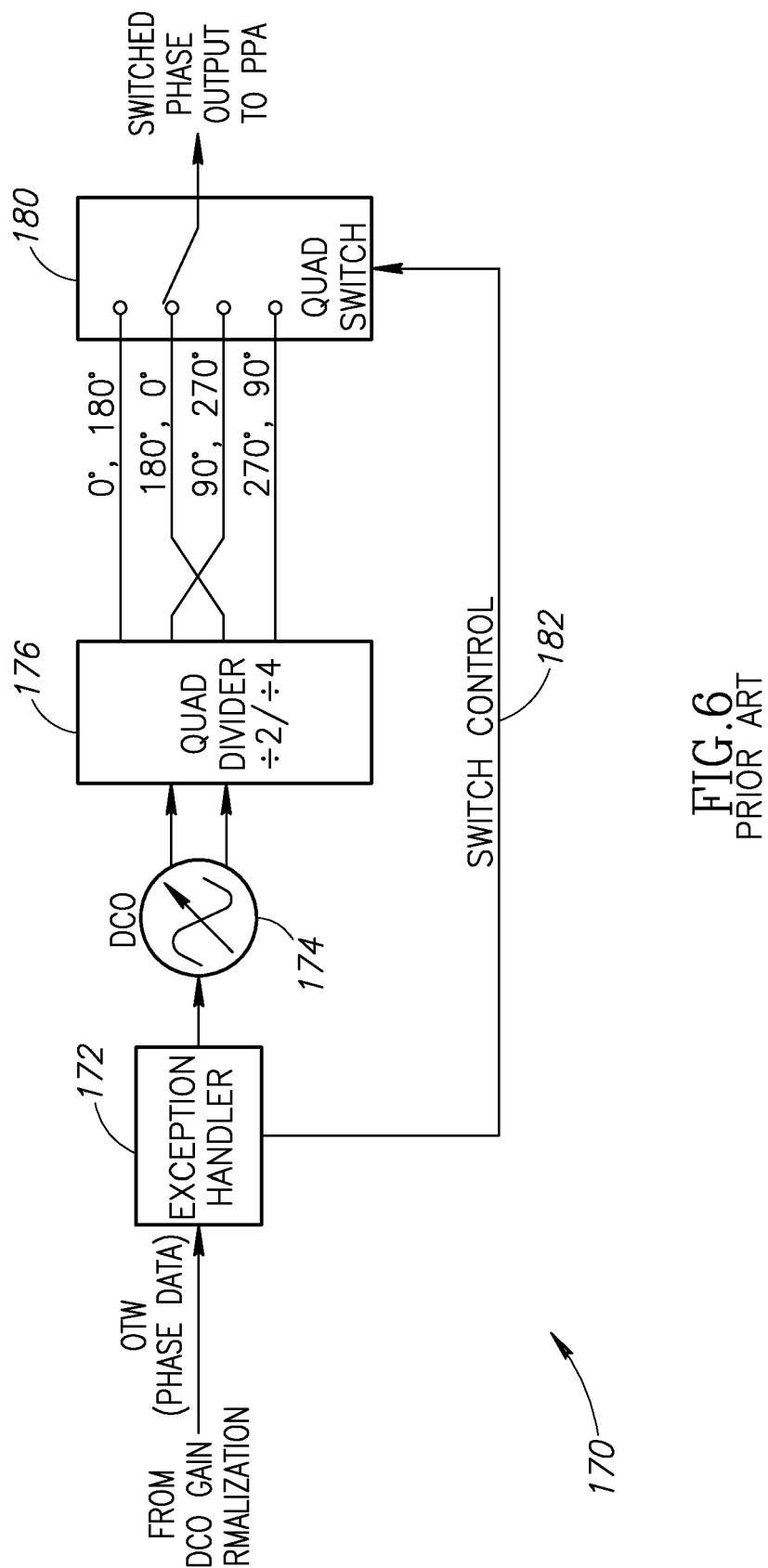
FIG. 6 is a block diagram illustrating an example prior art solution for using a local oscillator exception handling mechanism to reduce the DCO phase modulation bandwidth.
Figure 7:
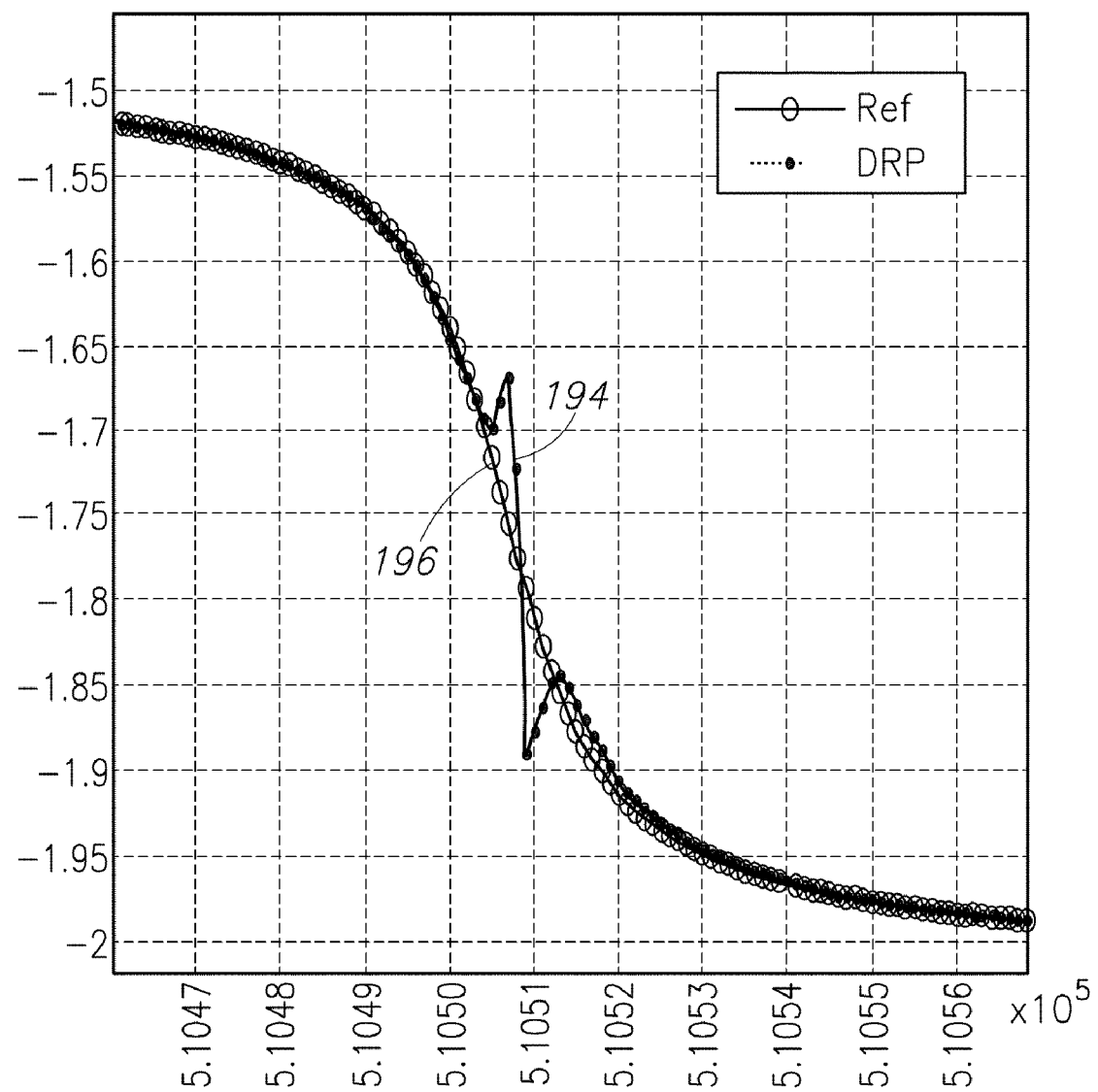
FIG. 7 is a graph illustrating the phase discontinuity resulting from the use of the prior art local oscillator exception handling mechanism of FIG. 6.

The following notation is used throughout this document.

| Term | Definition |
|---|---|
| AC | Alternating Current |
| ACW | Amplitude Control Word |
| ADC | Analog to Digital Converter |
| ADPLL | All Digital Phase Locked Loop |
| AM | Amplitude Modulation |
| ASIC | Application Specific Integrated Circuit |
| AVI | Audio Video Interface |
| BIST | Built-In Self Test |
| BMP | Windows Bitmap |
| BW | Bandwidth |
| BWR | Bandwidth Reduction |
| CIC | Cascaded Integrator-Comb |
| CMOS | Complementary Metal Oxide Semiconductor |
| CORDIC | COordinate Rotation DIgital Computer |
| CPU | Central Processing Unit |

| Term | Definition |
|---|---|
| DAC | Digital to Analog Converter |
| dB | Decibel |
| DBB | Digital Baseband |
| DC | Direct Current |
| DCO | Digitally Controlled Oscillator |
| DCS | Digital Cellular System |
| DCXO | Digitally Controlled Crystal Oscillator |
| DFC | Digital-to-Frequency Conversion |
| DPA | Digitally Controlled Power Amplifier |
| DPPA | Digital Pre-Power Amplifier |
| DRAC | Digital to RF Amplitude Conversion |
| DRP | Digital RF Processor or Digital Radio Processor |
| DSL | Digital Subscriber Line |
| DSP | Digital Signal Processor |
| EDGE | Enhanced Data Rates for GSM Evolution |
| EEPROM | Electrically Erasable Programmable Read Only Memory |
| EPROM | Erasable Programmable Read Only Memory |
| eSCO | Extended Synchronous Connection-Oriented |
| EVM | Error Vector Magnitude |
| EVM | Error Vector Magnitude |
| FCC | Federal Communications Commission |
| FCW | Frequency Command Word |
| FIB | Focused Ion Beam |
| FIR | Finite Impulse Response |
| FM | Frequency Modulation |
| FOH | First Order Hold |
| FPGA | Field Programmable Gate Array |
| FTW | Frequency Tuning Word |
| GGE | GSM/GPRS/EDGE |
| GMSK | Gaussian Minimum Shift Keying |
| GPRS | General Packet Radio Service |
| GPS | Global Positioning System |
| GSM | Global System for Mobile communications |
| HB | High Band |
| HDL | Hardware Description Language |
| HPF | High Pass Filter |
| I | Interface |
| IC | Integrated Circuit |
| ICI | Inter-Chip Interference |
| IEEE | Institute of Electrical and Electronics Engineers |
| IIR | Infinite Impulse Response |
| JPG | Joint Photographic Experts Group |
| LAN | Local Area Network |
| LB | Low Band |
| LDO | Low Drop Out |
| LO | Local Oscillator |
| LPF | Low Pass Filter |
| MAC | Media Access Control |
| MAP | Media Access Protocol |
| MBOA | Multiband OFDM Alliance |
| MIM | Metal Insulator Metal |
| MOS | Metal Oxide Semiconductor |
| MOSCAP | MOS Capacitor |
| MP3 | MPEG-1 Audio Layer 3 |
| MPG | Moving Picture Experts Group |
| OTW | Oscillator Tuning Word |
| PA | Power Amplifier |
| PAN | Personal Area Network |
| PC | Personal Computer |
| PCI | Personal Computer Interconnect |
| PCS | Personal Communications Service |
| PD | Phase Detector |
| PDA | Personal Digital Assistant |
| PE | Phase Error |
| PHE | Phase Error |
| PLL | Phase Locked Loop |
| PM | Phase Modulation |
| PNA | Personal Navigation Assistant |
| PPA | Pre-Power Amplifier |
| PSK | Phase Shift Keying |
| PVT | Process, Voltage, Temperature |
| QoS | Quality of Service |
| RAM | Random Access Memory |
| RAT | Radio Access Technology |
| RF | Radio Frequency |
| RFBIST | RF Built-In Self Test |
| RMS | Root Mean Squared |
| ROM | Read Only Memory |
| RRC | Raised Root Cosine |
| SAM | Sigma-Delta Amplitude Modulation |
| SAW | Surface Acoustic Wave |
| SCO | Synchronous Connection-Oriented |
| SDIO | Secure Digital Input/Output |
| SEM | Spectral Emission Mask |
| SIM | Subscriber Identity Module |
| SNR | Signal to Noise Ratio |
| SoC | System on Chip |
| SPI | Serial Peripheral Interconnet |
| SRAM | Static Read Only Memory |
| SRC | Sample Rate Conversion |
| SYNTH | Synthesizer |
| TDC | Time to Digital Converter |
| TDD | Time Division Duplex |
| TV | Television |
| USB | Universal Serial Bus |
| UWB | Ultra Wideband |
| VCO | Voltage Controlled Oscillator |
| WCDMA | Wideband Code Division Multiple Access |
| WiFi | Wireless Fidelity |
| WiMAX | Worldwide Interoperability for Microwave Access |
| WiMedia | Radio platform for UWB |
| WLAN | Wireless Local Area Network |
| WMA | Windows Media Audio |
| WMAN | Wireless Metropolitan Area Network |
| WMV | Windows Media Video |
| WPAN | Wireless Personal Area Network |

DETAILED DESCRIPTION OF THE INVENTION

The present invention is a novel and useful apparatus for and method of reducing phase and amplitude modulation bandwidth in polar transmitters. The bandwidth reduction mechanism of the present invention effectively reduces the phase modulation bandwidth of the polar modulation performed in the transmitter by modifying the zero-crossing trajectories in the IQ domain. This significantly reduces the phase modulation bandwidth while still meeting the output spectrum and error vector magnitude (EVM) requirements of the particular modern wideband wireless standard, such as 3G WCDMA, etc.

The bandwidth reduction mechanism described herein is suitable for use in any application employing polar modulation that requires the generation of a wideband signal from an oscillator having a limited modulation range. An example application is provided of a single chip radio, e.g., WCDMA, etc., that integrates the RF circuitry with the digital base band (DBB) circuitry on the same die.

Although the bandwidth reduction mechanism is applicable to numerous wireless communication standards and can be incorporated in numerous types of wireless or wired communication devices such a multimedia player, mobile station, cellular phone, PDA, DSL modem, WPAN device, etc., it is described in the context of a digital RF processor (DRP) based transmitter that may be adapted to comply with a particular wireless communications standard such as GSM, Bluetooth, EDGE, WCDMA, WLAN, WiMax, etc. It is appreciated, however, that the invention is not limited to use with any particular communication standard and may be used in optical, wired and wireless applications. The invention is primarily intended for use in applications employing a polar transmitter where it is desired to reduce the phase and amplitude modulation bandwidth of the polar modulation.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, WiMAX, WiMedia, WiFi, or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa.

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.). The user input means is typically formed of one or more manually operated switches, buttons, wheels or other user input means. Examples of multimedia devices include pocket sized personal digital assistants (PDAs), personal navigation assistants (PNAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software embodiment or an embodiment containing a combination of hardware and software elements. In one embodiment, a portion of the mechanism of the invention can be implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Single Chip Radio

Figure 8:
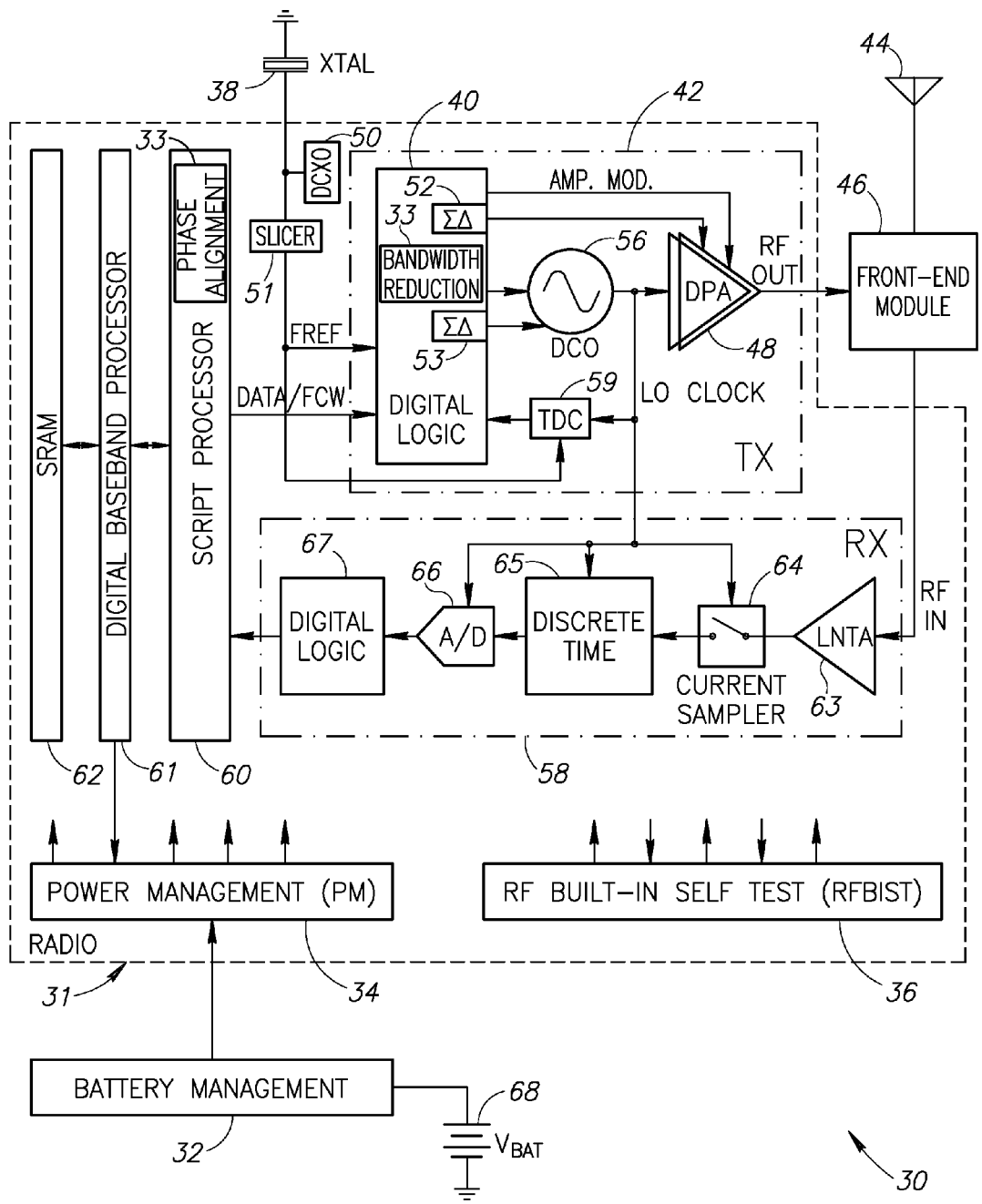
FIG. 8 is a block diagram illustrating an example single chip radio incorporating the bandwidth reduction mechanism of the present invention.

A block diagram illustrating an example single chip radio incorporating the bandwidth reduction mechanism of the present invention is shown in FIG. 8. For illustration purposes, the transmitter may be adapted for any desired cellular standard, e.g., WCDMA, GSM/EDGE, etc. It is appreciated, however, that one skilled in the communication arts can adapt the transmitter illustrated herein to other modulations and communication standards as well without departing from the spirit and scope of the present invention.

The radio circuit, generally referenced 30, comprises a single chip radio integrated circuit (IC) 31 coupled to a crystal 38, front end module (FEM) 46, antenna 44 and battery management circuit 32 connected to a battery 68. The radio chip 31 comprises a script processor 60, digital baseband (DBB) processor 61, memory 62 (e.g., static RAM), TX block 42, RX block 58, digitally controlled crystal oscillator (DCXO) 50, slicer 51, power management unit 34 and RF built-in self test (BIST) 36. The TX block comprises high speed and low speed digital logic block 40 including bandwidth reduction block 33, ΣΔ modulators 52, 53, digitally controlled oscillator (DCO) 56, TDC 59 and digitally controlled power amplifier (DPA) or pre-power amplifier (PPA) 48. The ADPLL and transmitter generate various radio frequency signals. The RX block comprises a low noise transconductance amplifier 63, current sampler 64, discrete time processing block 65, analog to digital converter (ADC) 66 and digital logic block 67 for the digital processing of the recovered signal in the receiver.

In accordance with the invention, the radio comprises a bandwidth reduction block 33 operative to detect zero crossings and adjust the IQ trajectory accordingly such that the phase/frequency modulation bandwidth is reduced. The bandwidth reduction block may be implemented in hardware, software or a combination of hardware and software. Alternatively, the bandwidth reduction block may be implemented as a software task on the script processor.

The structure presented herein has been used to develop multiple generations of a Digital RF Processor (DRP) for single-chip Bluetooth, GSM, GSM/EDGE and WCDMA radios which may be realized in 130 nm, 90 nm, 65 nm, 45 nm digital CMOS process technologies, for example. The common architecture is highlighted in FIG. 8 with features added specific to the cellular radio, such as the DCXO. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base-station-synchronized frequency reference such that the transmitted carrier frequencies and the received symbol rates are accurate to within 0.1 ppm. Digital logic built around the DCO realizes an all-digital PLL (ADPLL) that is used as a local oscillator for both the transmitter and the receiver. The polar transmitter architecture utilizes the wideband direct frequency modulation capability of the ADPLL and a digitally controlled power amplifier (DPA) 48 for the amplitude modulation. The DPA operates in near-class-E mode and uses an array of nMOS transistor switches to regulate the RF amplitude and acts as a digital-to-RF amplitude converter (DRAC). It is followed by a matching network and an external front-end module 46, which comprises a power amplifier (PA), a transmit/receive switch for the common antenna 44 and RX surface acoustic wave (SAW) filters. Fine amplitude resolution is achieved through high-speed ΣΔ dithering of the DPA nMOS transistors.

The receiver 58 employs a discrete-time architecture in which the RF signal is directly sampled at the Nyquist rate of the RF carrier and processed using analog and digital signal processing techniques. The transceiver is integrated with a script processor 60, dedicated digital base band processor 61 (i.e. ARM family processor or DSP) and SRAM memory 62. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz (could be 38.4 MHz or other) digitally controlled crystal oscillator (DCXO) 50 coupled to slicer 51. An integrated power management (PM) system is connected to an external battery management circuit 32 that conditions and stabilizes the supply voltage. The PM comprises multiple low drop out (LDO) regulators that provide internal supply voltages and also isolate supply noise between circuits. The RF built-in self-test (RFBIST) 36 performs autonomous phase noise and modulation distortion testing, and various loopback configurations for transmitter and receiver tests. The transceiver is integrated with the digital baseband and SRAM in a complete system-on-chip (SoC) solution. Almost all the clock signals on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape-filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, to Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

Mobile Device/Cellular Phone/PDA/PNA

Figure 9:
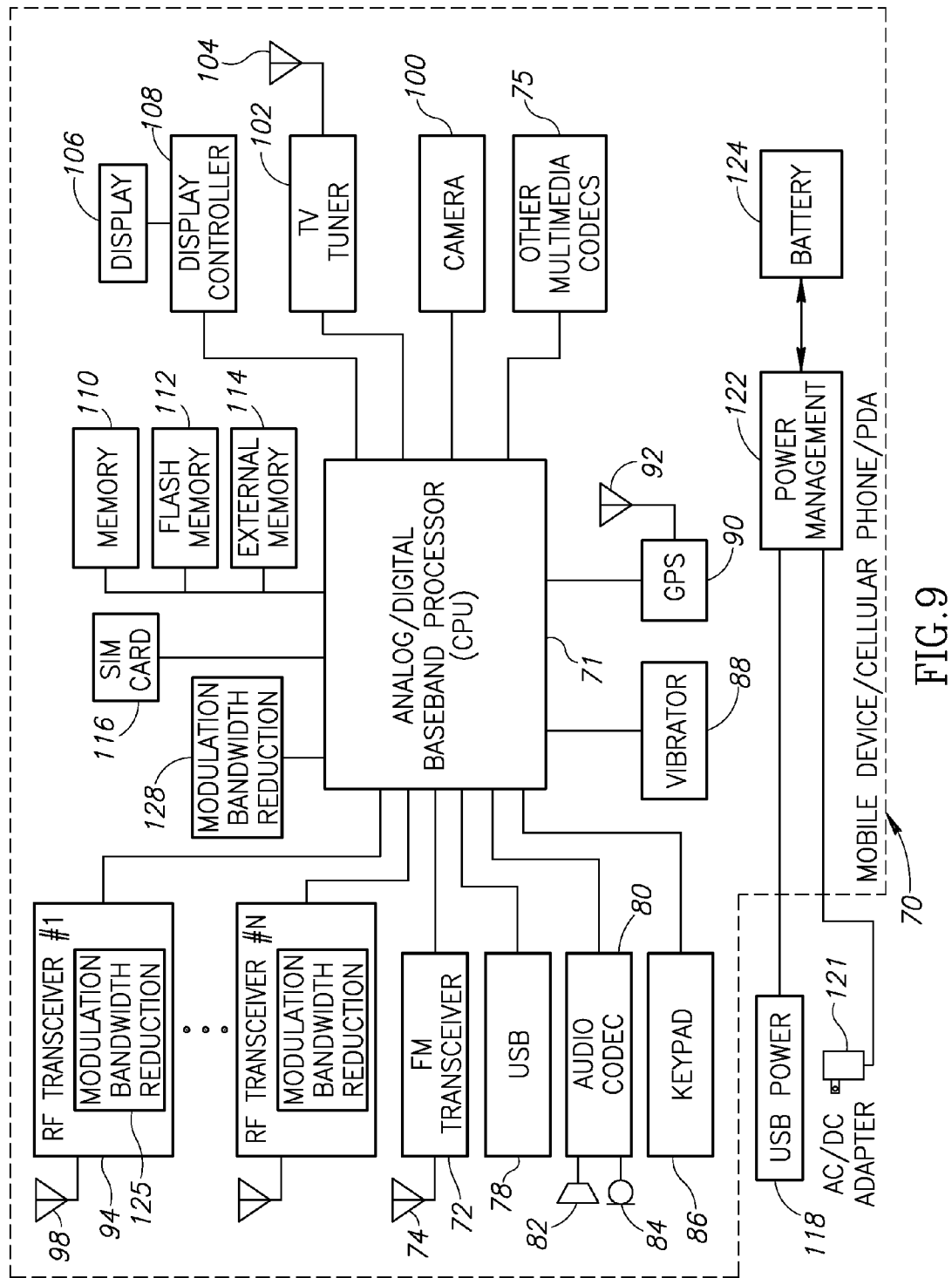
FIG. 9 is a simplified block diagram illustrating an example mobile communication device incorporating the bandwidth reduction mechanism of the present invention within multiple radio transceivers.

A simplified block diagram illustrating an example mobile communication device incorporating the bandwidth reduction mechanism of the present invention within multiple radio transceivers is shown in FIG. 9. Note that the mobile device may comprise any suitable wired or wireless device such as multimedia player, mobile communication device, cellular phone, smartphone, PDA, PNA, Bluetooth device, etc. For illustration purposes only, the device is shown as a mobile device, such as a cellular phone. Note that this example is not intended to limit the scope of the invention as the bandwidth reduction mechanism of the present invention can be implemented in a wide variety of communication devices.

The mobile device, generally referenced 70, comprises a baseband processor or CPU 71 having analog and digital portions. The mobile device may comprise a plurality of RF transceivers 94 and associated antennas 98. RF transceivers for the basic cellular link and any number of other wireless standards and Radio Access Technologies (RATs) may be included. Examples include, but are not limited to, Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN network; near field communications; UWB; etc. One or more of the RF transceivers may comprise additional antennas to provide antenna diversity which yields improved radio performance. The mobile device may also comprise internal RAM and ROM memory 110, Flash memory 112 and external memory 114.

Several user-interface devices include microphone(s) 84, speaker(s) 82 and associated audio codec 80 or other multimedia codecs 75, a keypad 86 for entering dialing digits and for other controls and inputs, vibrator 88 for alerting a user, camera and related circuitry 100, a TV tuner 102 and associated antenna 104, display(s) 106 and associated display controller 108 and GPS receiver 90 and associated antenna 92. A USB or other interface connection 78 (e.g., SPI, SDIO, PCI, etc.) provides a serial link to a user's PC or other device. An FM transceiver 72 and antenna 74 provide the user the ability to listen to FM broadcasts as well as the ability to transmit audio over an unused FM station at low power, such as for playback over a car or home stereo system having an FM receiver. SIM card 116 provides the interface to a user's SIM card for storing user data such as address book entries, user identification, etc.

The RF transceivers 94 also comprise the modulation bandwidth reduction mechanism 125 of the present invention. Alternatively (or in addition to), the bandwidth reduction mechanism may be implemented as a task 128 executed by the baseband processor 71. The bandwidth reduction blocks 125, 128 are adapted to implement the bandwidth reduction mechanism of the present invention as described in more detail infra. In operation, the bandwidth reduction mechanism may be implemented as hardware, software or as a combination of hardware and software. Implemented as a software task, the program code operative to implement the bandwidth reduction mechanism of the present invention is stored in one or more memories 110, 112 or 114 or local memories within the baseband.

Portable power is provided by the battery 124 coupled to power management circuitry 122. External power is provided via USB power 118 or an AC/DC adapter 121 connected to the battery management circuitry 122, which is operative to manage the charging and discharging of the battery 124.

ADPLL Based Polar Transmitter

Figure 10:
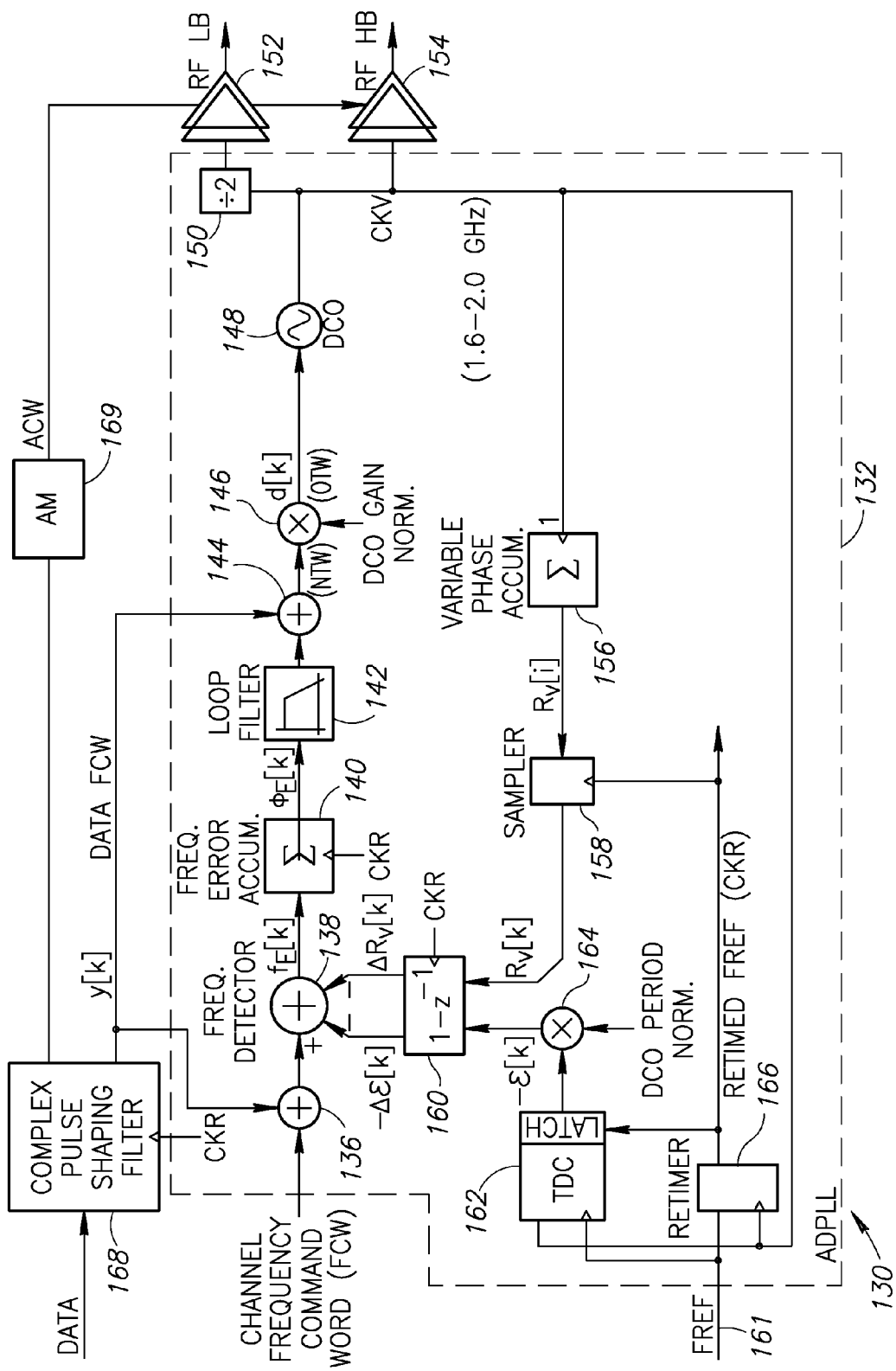
FIG. 10 is a block diagram illustrating an example ADPLL suitable for use with the present invention.

A block diagram illustrating an example ADPLL suitable for use with the present invention is shown in FIG. 10. The ADPLL presented herein is operative to receive the frequency and amplitude commands generated prior. The input TX IQ data is first subject to modulation bandwidth reduction processing where zero crossings are detected and the trajectory of the data is modified accordingly in response thereto. The modified TX IQ data is then input to a CORDIC which functions to convert the Cartesian (i.e. IQ) input data to the polar domain (i.e. amplitude and frequency components) which is used to generate the amplitude and frequency commands input to the ADPLL.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, to Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

For illustration purposes only, the transmitter, as shown, is adapted for the GSM/EDGE cellular standards. It is appreciated, however, that one skilled in the communication arts can adapt the transmitter illustrated herein to other modulations and communication standards as well without departing from the spirit and scope of the present invention.

The transmitter, generally referenced 130, is well-suited for a deep-submicron CMOS implementation. The transmitter comprises a complex pulse shaping filter 168, amplitude modulation (AM) block 169 and ADPLL 132. The circuit 130 is operative to perform complex modulation in the polar domain in addition to the generation of the local oscillator (LO) signal for the receiver. All clocks in the system are derived directly from this source. Note that the transmitter is constructed using digital techniques that exploit the high speed and high density of the advanced CMOS, while avoiding problems related to voltage headroom. The ADPLL circuit replaces a conventional RF synthesizer architecture (based on a voltage-controlled oscillator (VCO) and a phase/frequency detector and charge-pump combination), with a digitally controlled oscillator (DCO) 148, a time-to-digital converter (TDC) 162 and a non-integer LO divider 134. All inputs and outputs are digital and some even at multi-GHz frequency.

The core of the ADPLL is a digitally controlled oscillator (DCO) 148 adapted to generate the RF oscillator clock CKV. The oscillator core (not shown) could be provisioned to operate at a rational multiplier of the 1.6-2.0 GHz (e.g., 4/3) high band frequency or at a rational multiplier of the 0.8-1.0 GHz low band frequency (e.g., 4/3). The DCO core frequency is divided using a divider (not shown) for precise generation of RX quadrature signals, and for use as the transmitter's carrier frequency. The single DCO could be shared between transmitter and receiver and is used for both the high frequency bands (HB) and the low frequency bands (LB). The full duplex system, however, requires the use of local oscillators for the transmitter and receiver operating at different frequencies. In addition to the integer control of the DCO, at least 3-bits of the minimal varactor size used are dedicated for $\Sigma\Delta$ dithering in order to improve frequency resolution. The DCO comprises a plurality of varactor banks, which may be realized as n-poly/n-well inversion type MOS capacitor (MOSCAP) devices or Metal Insulator Metal (MIM) devices that operate in the flat regions of their C-V curves to assist digital control.

The OTW output of the gain normalization 146 is input to the DCO 148 which generates an RF signal having four quadrature phases in accordance with an input command signal. The output of the DCO is input to the RF high band Digital Pre-power amplifier (DPPA) 154. It is also input to the RF low band pre-power amplifier 152 after divide by two via divider 150.

The expected variable frequency $f_V$ at the DCO output is related to the reference frequency $f_R$ by the frequency command word (FCW).

$$FCW[k] \equiv \frac{E(f_V[k])}{f_R} \tag{3}$$

The FCW is time variant and is allowed to change with every cycle $T_R=1/f_R$ of the frequency reference clock. With $W_F=24$ the word length of the fractional part of FCW, the ADPLL provides fine frequency control with 1.5 Hz accuracy, according to:

$$\Delta f_{res} = \frac{f_R}{2^{W_F}} \tag{4}$$

The number of integer bits $W_I=8$ has been chosen to fully cover the GSM/EDGE and partial WCDMA band frequency range of $f_V=1,600\text{-}2,000$ MHz with an arbitrary reference frequency $f_R \geqq 8$ MHz.

The ADPLL operates in a digitally-synchronous fixed-point phase domain as follows: The variable phase accumulator 156 determines the variable phase $R_V[i]$ by counting the number of rising clock transitions of the DCO oscillator clock CKV as expressed below.

$$R_V[i] = \sum_{l=0}^{i} 1 \tag{5}$$

The index i indicates the DCO edge activity. The variable phase $R_V[i]$ is sampled via sampler 158 to yield sampled FREF variable phase $R_V[k]$, where k is the index of the FREF edge activity. The sampled FREF variable phase $R_V[k]$ is fixed-point concatenated with the normalized time-to-digital converter (TDC) 162 output $\epsilon[k]$. The TDC measures and quantizes the time differences between the frequency reference FREF and the DCO clock edges. The sampled differentiated (via block 160) variable phase is subtracted from the frequency command word (FCW) by the digital frequency detector 138. The frequency error $f_E[k]$ samples $$f_E[k]=FCW-[(R_V[k]-\epsilon[k])-(R_V[k-1]-\epsilon[k-1])] \tag{6}$$

are accumulated via the frequency error accumulator 140 to create the phase error $\phi_E[k]$ samples $$\phi_E[k] = \sum_{l=0}^{k} f_E[k] \tag{7}$$

which are then filtered by a fourth order IIR loop filter 142 and scaled by a proportional loop attenuator $\alpha$. A parallel feed with coefficient $\rho$ adds an integrated term to create type-II loop characteristics which suppress the DCO flicker noise.

The IIR filter is a cascade of four single stage filters, each satisfying the following equation:

$$y[k]=(1-\lambda)\cdot y[k-1]+\lambda \cdot x[k] \tag{8}$$

wherein
x[k] is the current input;
y[k] is the current output;
k is the time index;
$\lambda$ is the configurable coefficient;

The 4-pole IIR loop filter attenuates the reference and TDC quantization noise with an 80 dB/dec slope, primarily to meet the GSM/EDGE spectral mask requirements at 400 kHz offset. The filtered and scaled phase error samples are then multiplied by the DCO gain $K_{DCO}$ normalization factor $f_R/\hat{K}_{DCO}$ via multiplier 146, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 136 and 144. A hitless gear-shifting mechanism for the dynamic loop bandwidth control serves to reduce the settling time. It changes the loop attenuator a several times during the frequency locking while adding the $(\alpha_1/\alpha_2-1)\phi_1$ dc offset to the phase error, where indices 1 and 2 denote before and after the event, respectively. Note that $\phi_1=\phi_2$, since the phase is to be continuous.

The frequency reference FREF is input to the retimer 166 and provides the clock for the TDC 162. The FREF input is resampled by the RF oscillator clock CKV via retimer block 166 which may comprise a flip flop or register clocked by the reference frequency FREF. The resulting retimed clock (CKR) is distributed and used throughout the system. This ensures that the massive digital logic is clocked after the quiet interval of the phase error detection by the TDC. Note that in the example embodiment described herein, the ADPLL is a discrete-time sampled system implemented with all digital components connected with all digital signals.

Modulation Bandwidth Reduction Mechanism

Figure 11:
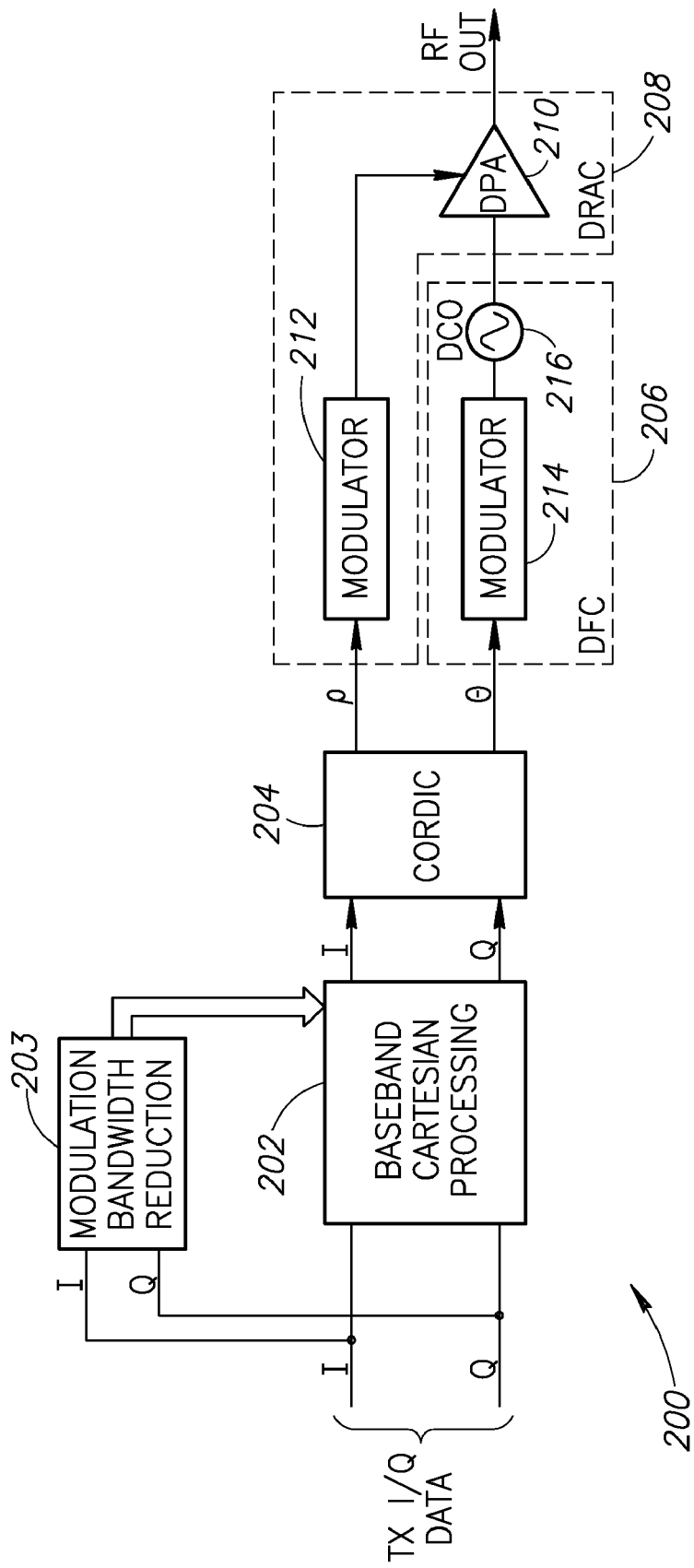
FIG. 11 is a block diagram illustrating a first example embodiment of the bandwidth reduction mechanism of the present invention.

A block diagram illustrating an example embodiment of the bandwidth reduction mechanism of the present invention is shown in FIG. 11. The example circuit, generally referenced 200, comprises a baseband Cartesian processing block 202, modulation bandwidth reduction block 203, CORDIC 204, digital-to-frequency conversion (DFC) block 206 (comprising ADPLL-based phase modulator 214 and DCO 216) and digital-to-RF-amplitude conversion (DRAC) block 208 (comprising amplitude modulator 212 and digital power amplifier (DPA) 210).

Depending on the application, the baseband Cartesian processing block 202 may perform various functions such as upsampling and filtering of the I and Q signals before they are converted to amplitude and phase/frequency signals by the CORDIC 204. In accordance with the invention, the modulation bandwidth reduction block 203 is operative to reduce the phase modulation bandwidth of the polar modulation by modifying the zero crossing trajectories, thereby significantly reducing the phase modulation bandwidth while still meeting particular output spectrum and EVM requirements. Note that the amplitude modulation bandwidth is also reduced by the mechanism of the invention thereby easing the amplitude modulation.

Figure 12:
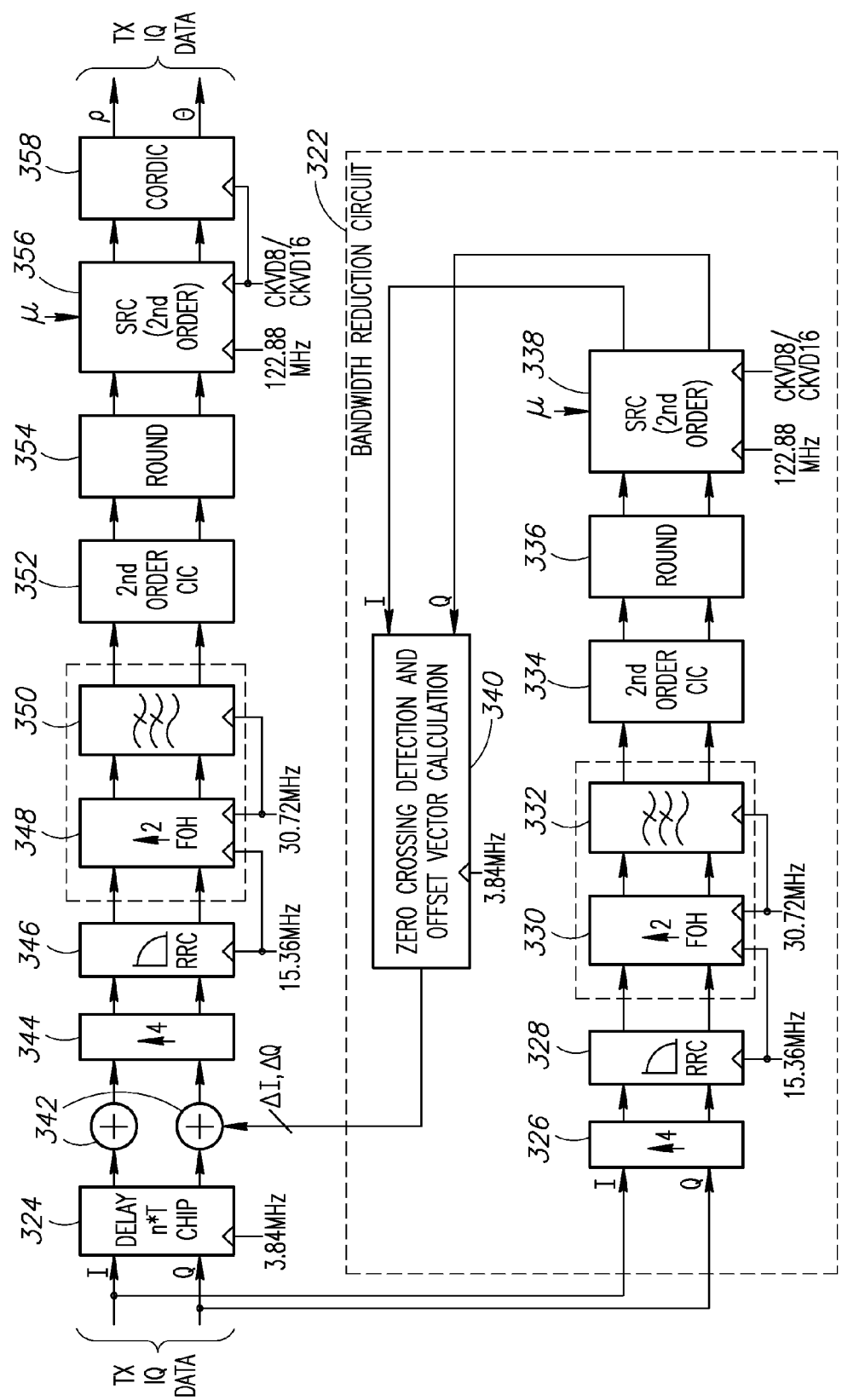
FIG. 12 is a block diagram illustrating a second example embodiment of the bandwidth reduction mechanism of the present invention.

A block diagram illustrating a second example embodiment of the bandwidth reduction mechanism of the present invention is shown in FIG. 12. The second example circuit, generally referenced 320, comprises bandwidth reduction circuit 322, delay 324, IQ adders 342, upsample by four 344, Root Raised-Cosine (RRC) pulse-shaping filter 346, upsample by two/first order hold (FOH) 348, low pass filter (HPF) 350, Cascaded Integrator-Comb (CIC) filter 352, truncation/rounding block 354, sample rate conversion (SRC) 356 and CORDIC 358. This comprises the main DTX processing signal path.

The bandwidth reduction circuit 322 comprises a duplicate of the main DTX processing path including upsample by four 326, Root Raised-Cosine (RRC) pulse-shaping filter 328, upsample by two/first order hold (FOH) 330, low pass filter (HPF) 332, Cascaded Integrator-Comb (CIC) filter 334, truncation/rounding block 336, sample rate conversion (SRC) 338 and zero-crossing detector and offset vector calculation 340.

In this second example embodiment, block 340 functions to read the output of a duplicate of the main DTX processing (i.e. without bandwidth reduction), performs zero-crossing detection and offset vector calculation, which is described in more detail infra. Note that the chip rate data (i.e. TX IQ data) must be latched until the offset vector is obtained and is ready to be added to the original data. This can be performed by the delay block 324. Once calculated, the offset vector is applied to the latched IQ data. Once the offset vector is applied, the IQ data with the correction is processed by the main DTX hardware path.

It is important to note that the DTX signal processing path inside the bandwidth reduction circuit 322 is only needed for purposes of zero-crossing detection. A third example embodiment described herein replaces the duplicate DTX signal path with two FIR filters which essentially mimic the processing performed by the duplicate DTX circuit, thus greatly simplifying the bandwidth reduction circuit size, complexity and cost.

Figure 13:
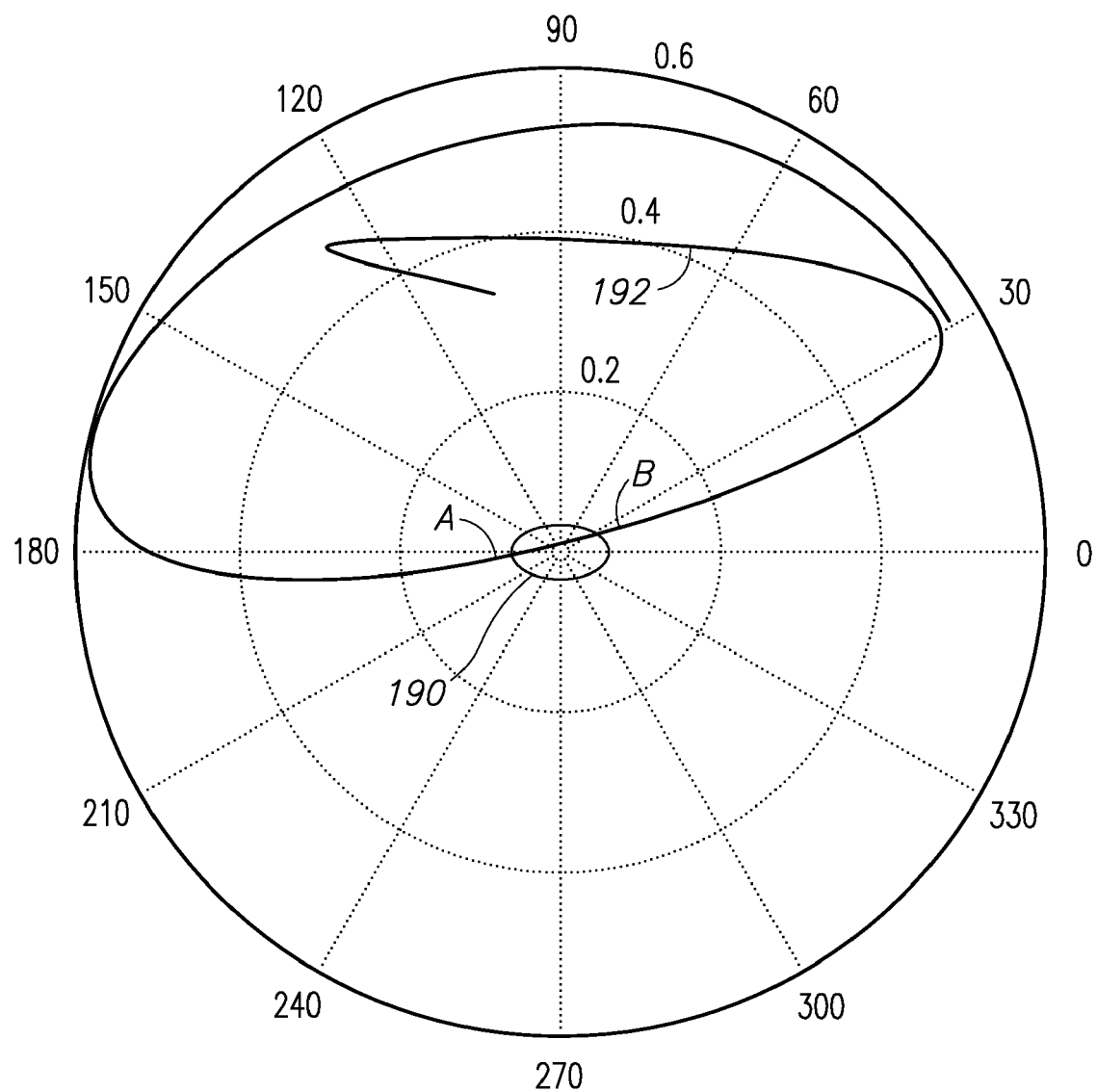
FIG. 13 is a diagram illustrating a sample trajectory passing near the origin.

A diagram illustrating a sample trajectory passing near the origin is shown in FIG. 13. The individual points on the trajectory 192 represent the data at the output of the duplicated DTX path (i.e. the output of the sample rate conversion (SRC) 338). For purposes of the mechanism of the invention, most data points are not useful for detecting the zero-crossing of the trajectory. For example, once the two points labeled A and B on the threshold circle 190 are known, zero-crossing detection and offset vector calculation can then be performed with sufficient accuracy. Assuming the two points are A ($I_A$, $Q_A$) and B ($I_B$, $Q_B$), the mechanism needs to determine four values ($I_A$, $Q_A$, $I_B$, $Q_B$) to detect zero-crossings.

The two points A and B are determined in the following manner. It is assumed that the DTX output (into block 340) is [DTX_I(n), DTX_Q(n)], wherein n is the integer index of the digital data. Assuming the DTX oversampling ratio is 64 (i.e. 64 samples with each chip period), point A may be expressed as the following:

$$[DTX\_I(k*64+a), DTX\_Q(k*64+a)] \tag{9}$$

and point B can be expressed as:

$$[DTX\_I(k*64+b), DTX\_Q(k*64+b)] \tag{10}$$

where k is the index of the particular chip;

a and b are different constant integer numbers (i.e. offsets) in the range (0~63) which are related to the latency of the DTX.

Note that A and B are at the chip rate and that a full DTX signal processing path is not needed to obtain A and B since most of the points are not needed to detect zero-crossings. Note also that any desired offsets for a and b may be chosen depending on the particular implementation of the invention.

Figure 14:
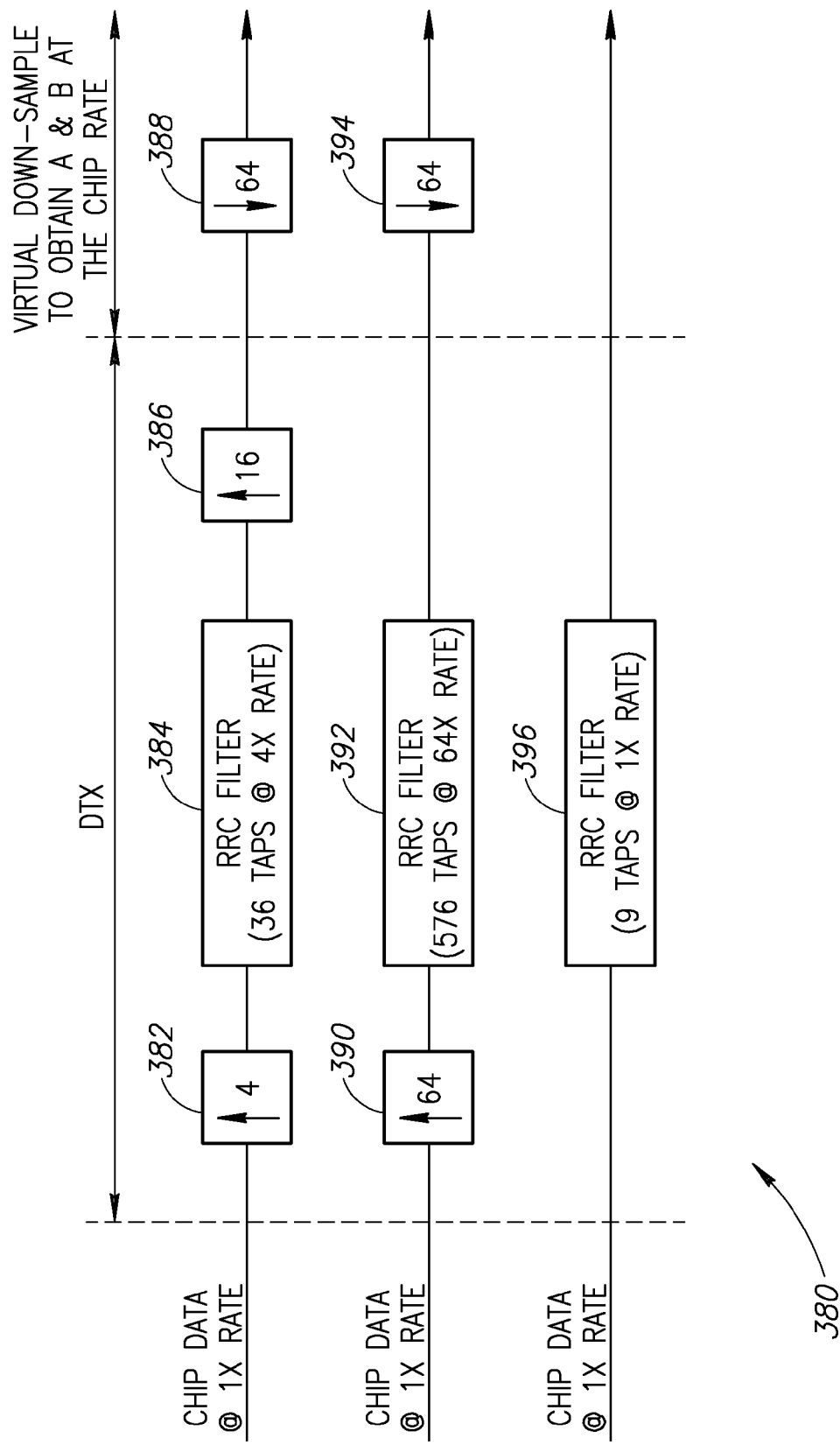
FIG. 14 is a block diagram illustrating a technique for simplifying DTX implementation.

An example of obtaining one of the four values needed is presented. A block diagram illustrating a technique for simplifying DTX implementation is shown in FIG. 14. The first row data path, comprising upsample by four 382, RRC filter 384 with 36 tap coefficients operating at a 4× rate, upsample by 16 386 and downsample by 64 388, represents a simplified DTX processing block. Mathematically, the first row data path is equivalent to the second row data path, comprising upsample by 64 390, RRC filter 392 with 576 tap coefficients operating at a 64× rate and downsample by 64 394, but with a higher rate RRC filter operating at a 64× rate. The RRC coefficients in this second row are the upsampled (16×) version of the original RRC filter.

The simplified implementation is shown in the third or bottom row data path, comprising RRC filter 396, wherein the filter runs at the chip rate and has only nine coefficient taps. These filter coefficients are downsampled (÷64) versions of the coefficients of the second row data path (or ¼ of the first row data path coefficients). Note that the absolute values of A ($I_A$, $Q_A$) and B ($I_B$, $Q_B$) are related to the offset of the coefficient downsampling, i.e. the simplified implementation (reduced interpolation) results in slightly coarse estimates of the point around the zero crossing.

Figure 15:
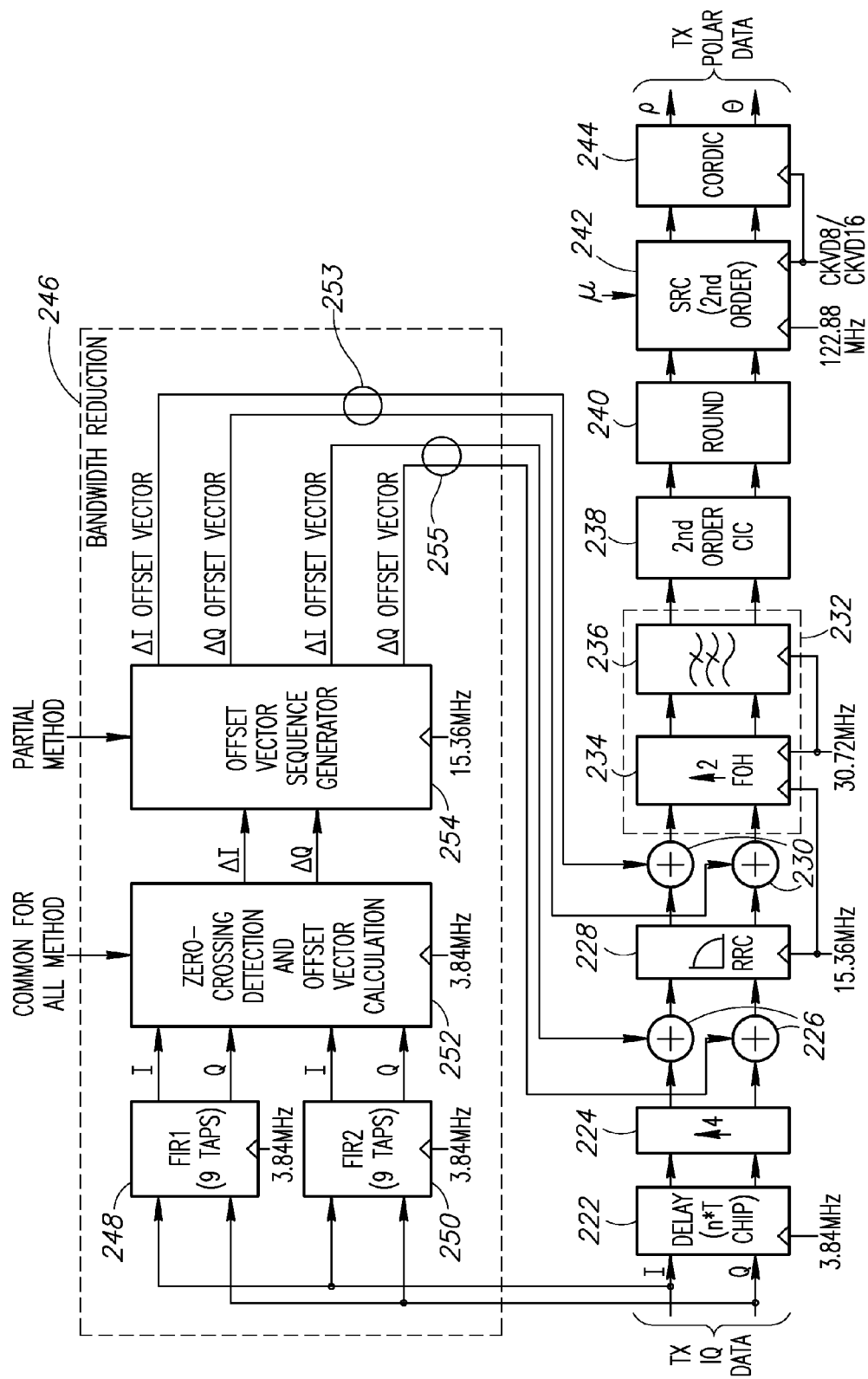
FIG. 15 is a block diagram illustrating a third example embodiment of the bandwidth reduction mechanism of the present invention.

A block diagram illustrating a third example embodiment of the bandwidth reduction mechanism of the present invention is shown in FIG. 15. The example circuit, generally referenced 220, comprises bandwidth reduction circuit 246, delay 222, upsample by four 224, IQ adders 226, 230, Root Raised-Cosine (RRC) pulse-shape filter 228, upsample by two/first order hold (FOH) 234, low pass filter (HPF) 236, Cascaded Integrator-Comb (CIC) filter 238, round block 240, sample rate conversion (SRC) 242 and CORDIC 244. The bandwidth reduction circuit 246 comprises FIR filters FIR1 248, and FIR2 250, zero crossing detection/offset vector calculation block 252 and offset vector sequence generator 254.

In this third example embodiment, the duplicate DTX path used to detect the zero-crossings and determine A ($I_A$, $Q_A$) and B ($I_B$, $Q_B$) is replaced with four real 9-tap RRC filters (or two complex FIR filters, namely FIR1 248 and FIR2 250). The two FIR filters, FIR1 and FIR2, use separate and different sets of coefficients to estimate A ($I_A$, $Q_A$) and B ($I_B$, $Q_B$) directly rather than use duplicated DTX circuitry. Thus, the complexity of the bandwidth reduction circuit is significantly reduced over the circuit of FIG. 12.

In operation, the TX IQ input data enters the circuit 220 at a rate 3.84 MHz and through several upsampling stages, enters the CORDIC at a rate orders of magnitude faster. In particular, the upsampling by four 224 increases the sample rate from 3.84 MHz to 15.36 MHz. Upsampling by two FOH 234 doubles the input sampling rate to 30.72 MHz. Additional stages increase the sampling rate to the rate desired at the input to the CORDIC.

Figure 16:
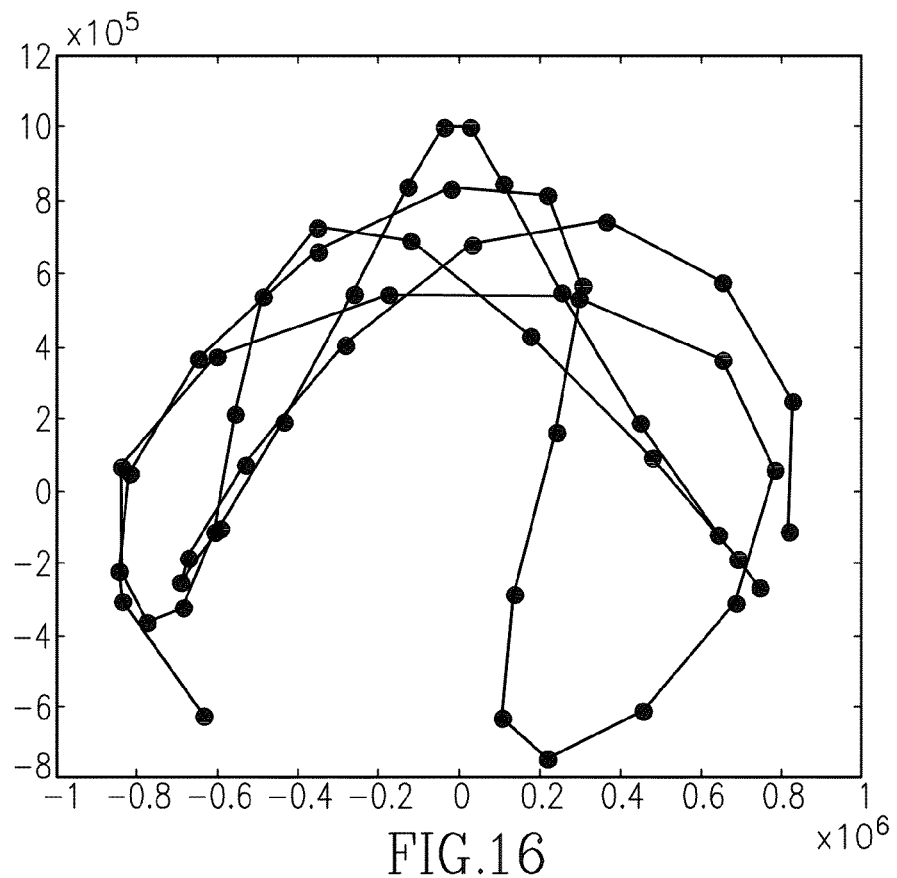
FIG. 16 is a plot illustrating the output of the RRC for several symbols at an upsampled 4× rate.

A plot illustrating the output of the RRC 228 for several symbols at an upsampled 4× rate is shown in FIG. 16. The trajectory shown in FIG. 16 is a zoomed in version of the data showing a transition through the origin and samples around the origin at the output of the RRC.

Figure 17:
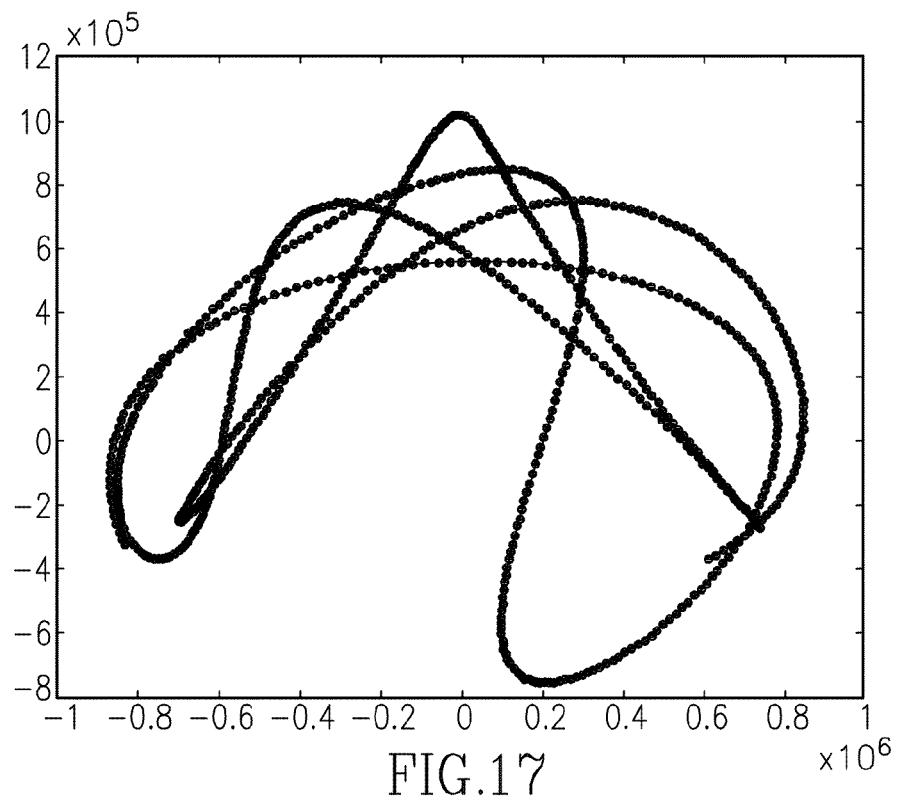
FIG. 17 is a plot illustrating the upsampled result at a 64× rate for several symbols.

A plot illustrating the upsampled result at a 64× rate for several symbols is shown in FIG. 17. The example trajectory in FIG. 17 represents the data output of the RRC 228 interpolated to 64 times the chip rate. Note that interpolation in the TX has the advantages of (1) improving the SNR; and (2) reducing the close-in spectral replicas, wherein the quantitative reduction depends on the particular type of interpolation performed. As a result of interpolation, fine spacing in the trajectory is achieved. This results in low quantization noise (high SNR) and enables implementation of the bandwidth reduction mechanism of the present invention.

The FIR filters 248, 250 in the bandwidth reduction circuit 246 function to simulate the bottom upsampling and filtering data path taken by the data. The coefficients of each filter, FIR1 and FIR2 are different in order to generate two data points for determining the trajectory of the input IQ data. The two IQ data points are output to the zero crossing detector circuit 252. If the trajectory passes within a threshold distance of the origin, an offset vector (ΔI, ΔQ) is calculated and output to the offset vector sequence generator 254 which is clocked at four times the rate of the offset vector calculator 252. In accordance with the invention, the offset vector can be applied to the IQ data directly or it can be spread over several IQ data samples at 1× or 4× rates.

The different options for applying and spreading the offset vectors calculated results in different performance, which typically involves trade-offs between spectrum and EVM performance. Since there are different spectrum and EVM requirements for different RF power levels, the mechanism of the present invention provides three bandwidth reduction methods for handling three different power levels.

A first method #1 is optimized for low RF power and provides the best EVM performance but with a relatively large degradation in spectrum. In this method, the offset sequence (ΔI, ΔQ) 253 is applied to the output of the RRC 228 via IQ adders 230. By adding the offset to the RRC output, the modified trajectory does not undergo RRC filtering, requiring less added delay in the TX path. The reduced filtering, however, manifests itself as degraded spectra as is shown infra.

Figure 20:
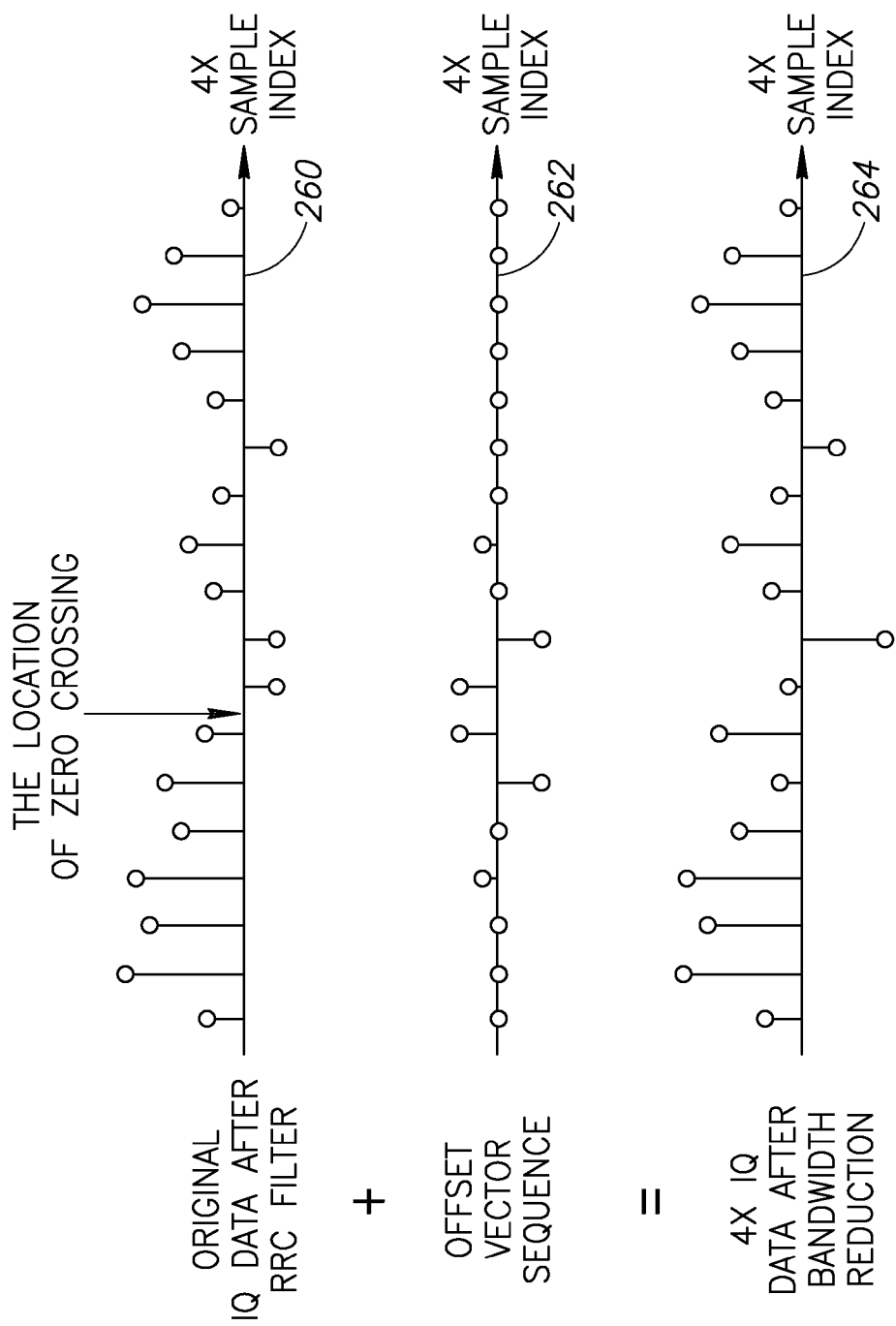
FIG. 20 is a diagram illustrating a first path shaping resulting from the addition of the offset vector sequence to the original data at the RRC output.

The path shaping for method #1 is shown in FIG. 20 which illustrates the path shaping resulting from the addition of the offset vector sequence to the original data at the output of the RRC. Sample stream 260 represents the original IQ data (either I or Q) after RRC filtering; sample stream 262 represents the offset vector sequence; and sample stream 264 represents the 4× IQ data after bandwidth reduction (i.e. after the offset vector sequence is added to the RRC filter output at 230).

A second method #2 is optimized for medium RF power and provides medium EVM performance with only a slight degradation in spectrum. In this method, the offset sequence (ΔI, ΔQ) 253 is applied to the input of the RRC 228 via IQ adders 226.

A third method #3 is optimized for high RF power and provides "zero" degradation in spectrum but with a relatively large degradation in EVM. In this method, the offset sequence (ΔI, ΔQ) 253 is applied to the input of the RRC 228 via IQ adders 226.

A fourth method #4 is an enhancement of method #2 with the key difference being the transfer function used in the offset vector sequence generator 254. In this method, the offset sequence (ΔI, ΔQ) 253 is applied to the input of the RRC 228 via IQ adders 226. This method achieves both reduced EVM impact and reduced spectral degradation and spectral replica images. This is achieved, however, at the cost of added complexity in the generation of the offset sequence.

Figure 21:
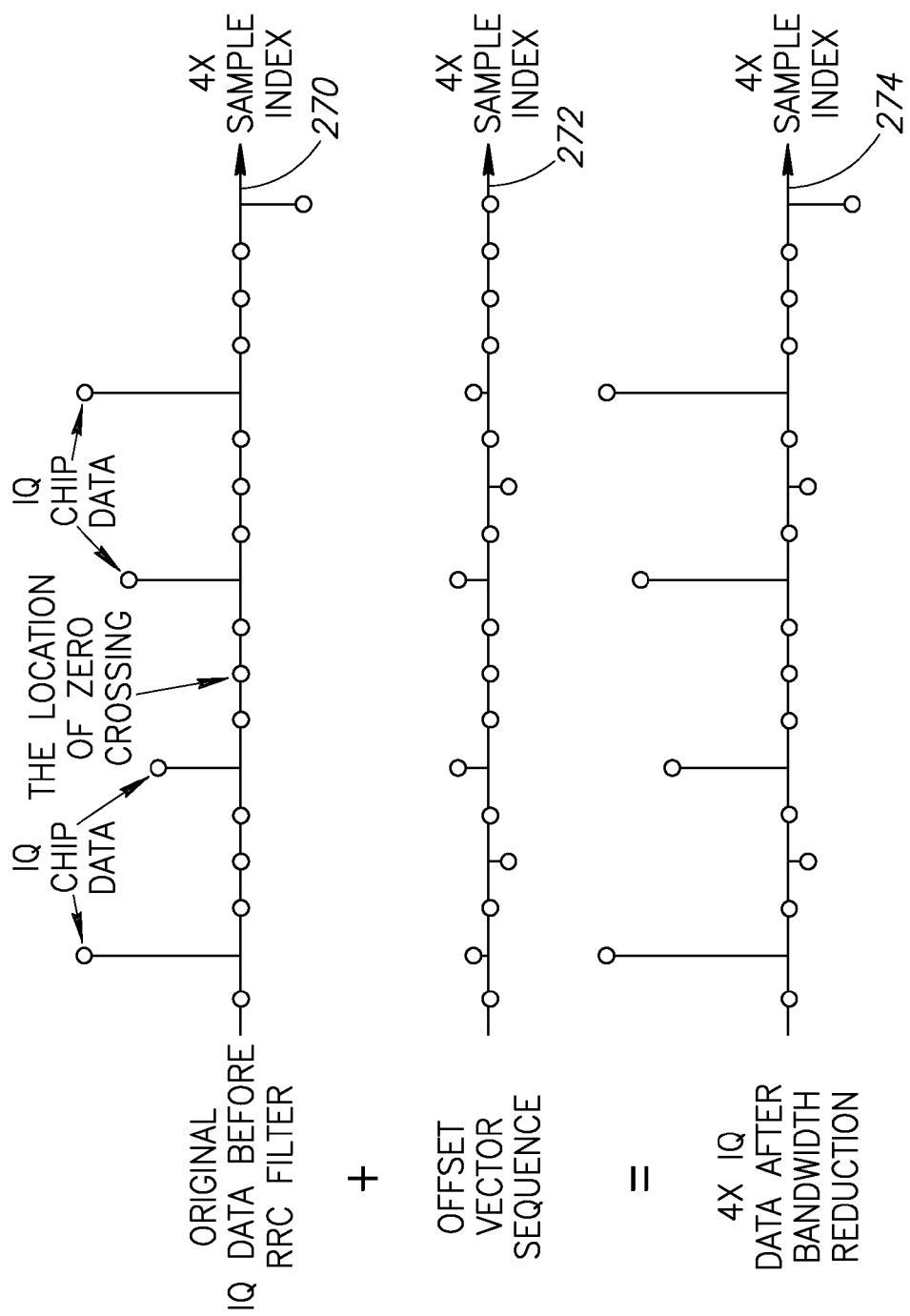
FIG. 21 is a diagram illustrating a second path shaping resulting from the addition of the offset vector sequence to the original data at the RRC input.

The path shaping for methods #2 and #3 is shown in FIG. 21 which illustrates the path shaping resulting from the addition of the offset vector sequence to the original data at the input of the RRC. Sample stream 270 represents the original IQ data (either I or Q) before RRC filtering; sample stream 272 represents the offset vector sequence; and sample stream 274 represents the 4× IQ data after bandwidth reduction (i.e. after the offset vector sequence is added to the RRC filter output at 226). Note that methods #2 and #3 have different offset vector sequences which results in different impacts to EVM, spectrum and inter-chip interference (ICI).

Note that the difference between methods #2 and #3 is in the sequence applied to the TX data. Note also that the delay (n) of method #1 is smaller than that of methods #2 and #3 since the data path added latency is reduced because the RRC is bypassed (i.e. offset vectors are applied to the output of the RRC 228 as opposed to its input). Methods #2 and #3, however, require a larger introduced latency in the data path due to the fact that the offset vectors are applied to the input of the RRC 228.

Note further that method #1 causes the least TX latency, (the RRC, typically a 36-tap FIR filter at chip times four rate, is bypassed) but results in much stronger signal spectral replicas in both amplitude and phase domains (see FIG. 27 and Table 1 infra) which causes the TX modulation spectrum degradation. Methods #2, #3 and #4 take advantage of RRC filtering (or alternately an additional non-RRC filter can be applied to the offset signal added in method #1), to reduce the baseband signal degradation.

It is important to note that although the bandwidth reduction mechanism alters the trajectory of the data signal, the impact on EVM is mostly negligible. This is due to the fact that the EVM is measured only during sampling instances which are never specified at the origin. As long as the starting/ending points of the symbol boundary (i.e. terminal values) are not affected, the EVM requirements of the particular wireless standard should not be violated. As long as the trajectory is not altered excessively, any spectral mask requirements should be met as well.

The signal path leading to the CORDIC is the path the data normally takes. The bandwidth reduction circuit is operative to generate an offset vector sequence that is added to the original data. The offset vectors, when added to the original data, effectively modifying the zero crossing trajectories in the digital domain. By altering the trajectory of the IQ data to keep it from passing through or near the origin (within a threshold distance), the phase modulation bandwidth of the polar modulation is reduced. The result of the trajectory modification also reduces the amplitude modulation bandwidth. Thus, the modified IQ data avoids "infinite" phase bandwidth which would be virtually impossible to implement the polar modulator due to the requirement of handling very fast changes of the DCO phase (i.e. very wide range of frequency modulation of the DCO).

Figure 18:
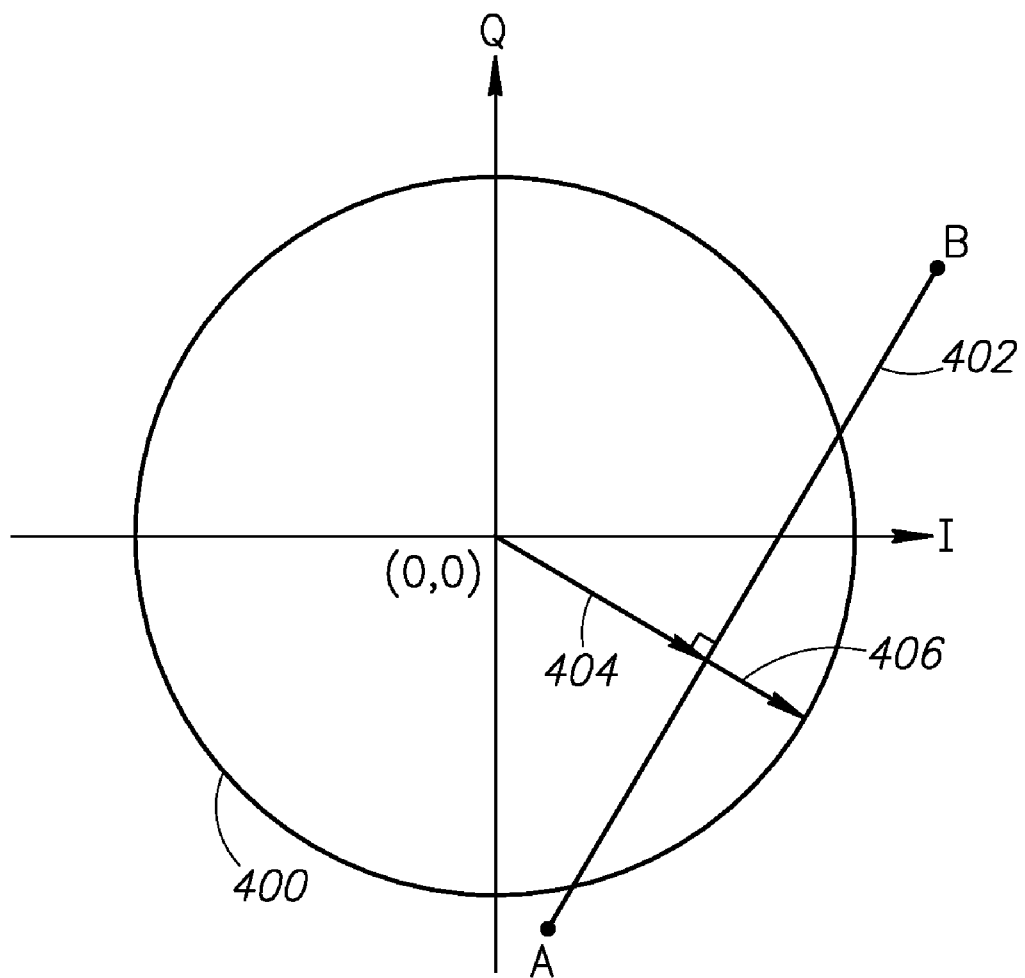
FIG. 18 is a IQ plot diagram illustrating the zero crossing detection offset vector generation mechanism of the present invention.
Figure 19:
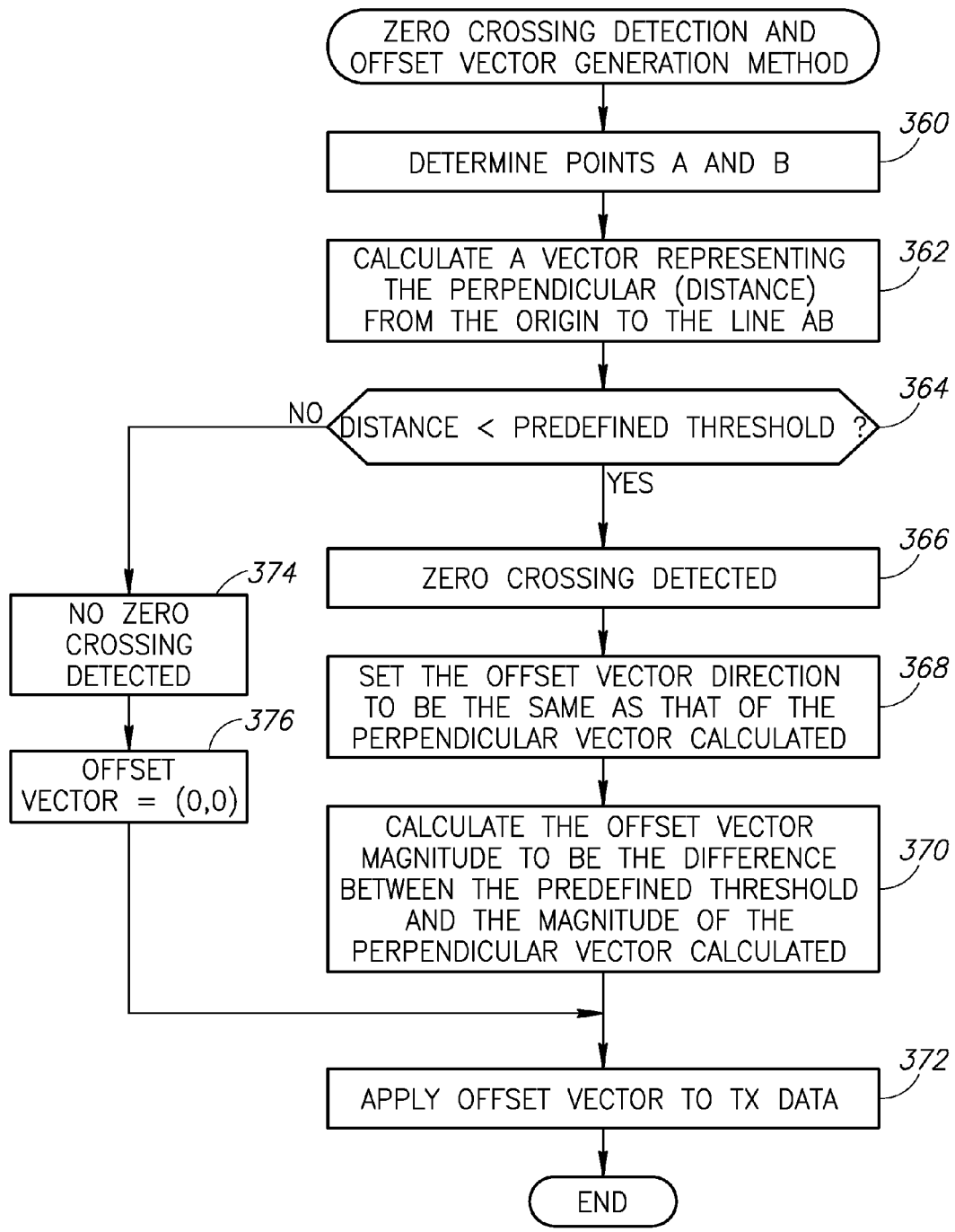
FIG. 19 is a flow diagram illustrating the zero crossing detection and offset vector sequence generator method of the present invention.

An IQ plot diagram illustrating the zero crossing detection offset vector generation mechanism of the present invention is shown in FIG. 18. A flow diagram illustrating the zero crossing detection and offset vector sequence generator method of the present invention is shown in FIG. 19. With reference to FIGS. 18 and 19, the circle 400 represents the threshold circle that the mechanism uses to detect trajectory zero-crossings. First, the points A and B are determined (step 360). These points are determined using the FIR1 248 and FIR2 250 filters (FIG. 15). Once the two points A and B are determined, the line AB is known as well. A vector representing the perpendicular (i.e. the distance) from the origin to the line AB is calculated (step 362). This perpendicular (i.e. distance) is presented by vector 404. Note that the vector may comprise a sequence of samples, i.e. a complex sample.

If the distance is greater than or equal to a predetermined threshold (i.e. the radius of circle 400) (step 364), than no zero-crossing is detected (step 374), the zero offset vector is set to zero (step 376) and the zero offset vector is applied to the TX data (step 372).

If the distance is less than the predetermined threshold (i.e. the radius of circle 400) (step 364), than a zero crossing is detected (step 366). The direction and magnitude of an offset vector ($\Delta I$, $\Delta Q$) (represented by arrow 406) is then calculated. This offset vector 406, when added to the TX data functions to keep the trajectory outside the threshold circuit 400. The offset vector direction is set to the same direction as that of the perpendicular vector calculated in step 362 (step 368). The offset vector magnitude is calculated to be the difference between the radius of the predetermined threshold circle 400 and the magnitude of the perpendicular vector calculated in step 362 (step 370). Thus, moving points A and B by the offset vector ($\Delta I$, $\Delta Q$) enables zero-crossing (or proximity to the origin causing large phase modulation bandwidth) of the trajectory to be avoided.

Once the offset vector ($\Delta I$, $\Delta Q$) is calculated, it is applied to the IQ data TX data directly, i.e. coarse correction (step 372). Alternatively, taking advantage of data path interpolation, the offset vector can be distributed over a plurality of IQ data samples at 1×. This is performed by the offset vector sequence generator 254 (FIG. 15) which functions to either (1) apply a predetermined sequence (determined based on the IQ signal bandwidth) or (2) is generated using a filter or kernel/fractal function, etc. Note that different techniques of spreading out the offset vector result in different performance, i.e. the mechanism can be implemented to realize trade-offs between TX EVM and modulated spectrum as a function of, for example, TX power level requirements, performance requirements, etc.

Figure 22:
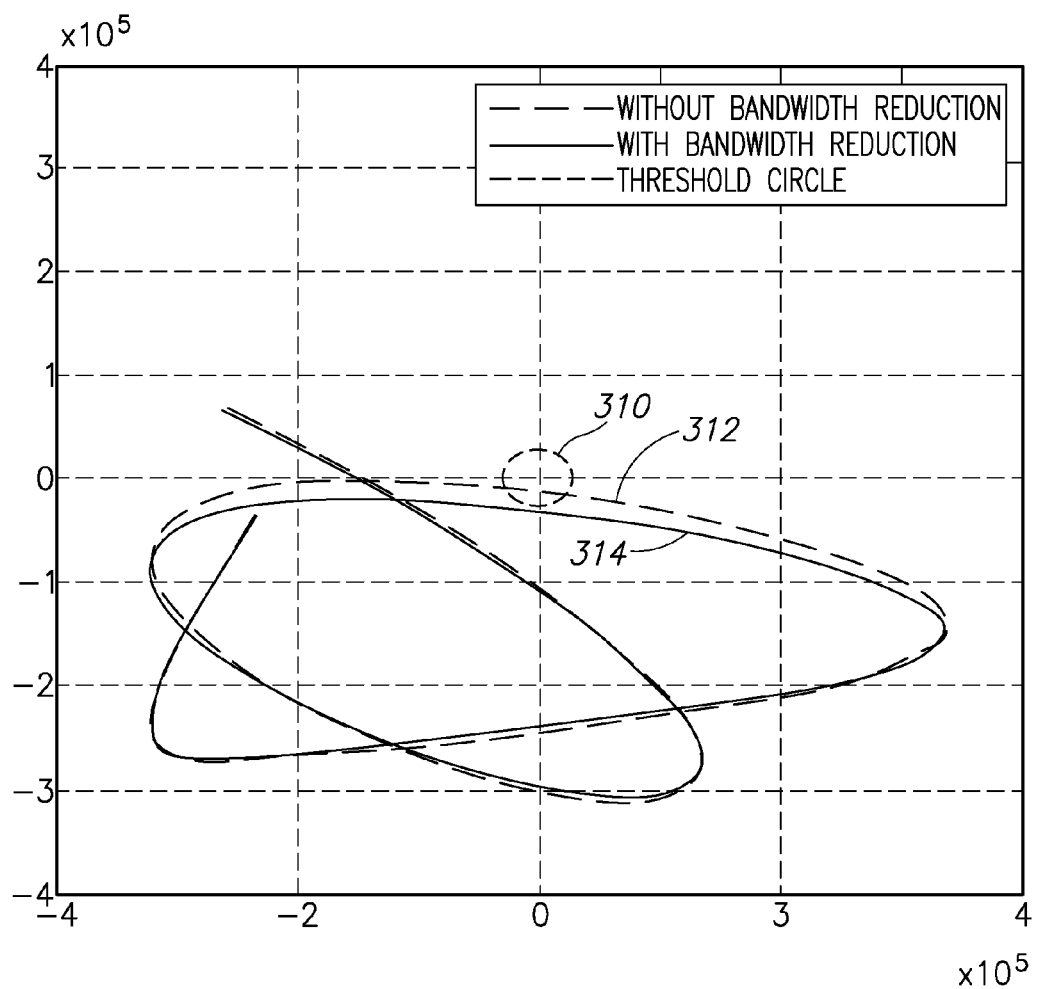
FIG. 22 is a plot illustrating the IQ modulation data path with and without the use of the modulation bandwidth reduction mechanism of the present invention.

A plot illustrating the IQ modulation data path with and without the use of the modulation bandwidth reduction mechanism of the present invention is shown in FIG. 22. The original trajectory before bandwidth reduction 312 (dashed trace) passes inside the threshold circle 310 around the origin. The trajectory after bandwidth reduction 314 (solid trace) is altered to avoid the threshold circle, thus reducing the phase modulation bandwidth of the polar modulation.

Figure 23A:
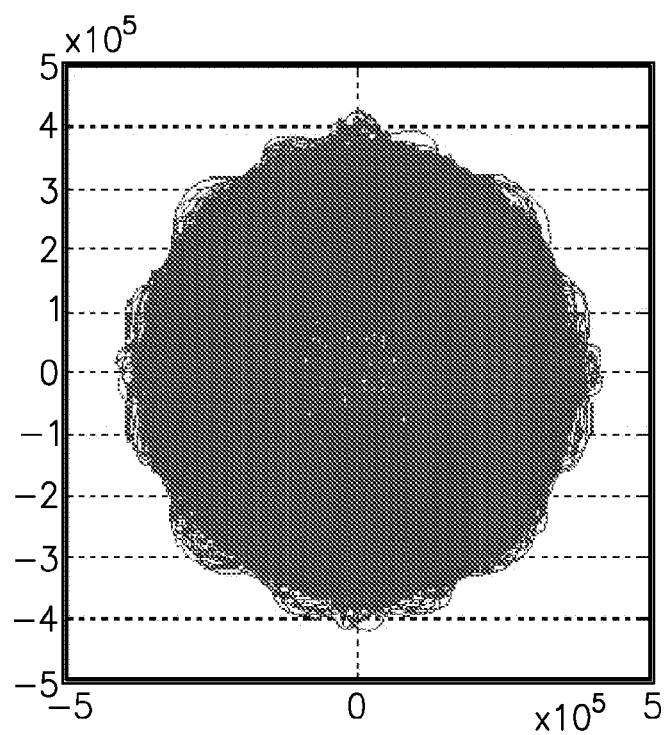
FIGS. 23A and 23B are graphs illustrating the zero-crossing region with and without the use of the modulation bandwidth reduction mechanism of the present invention.
Figure 23B:
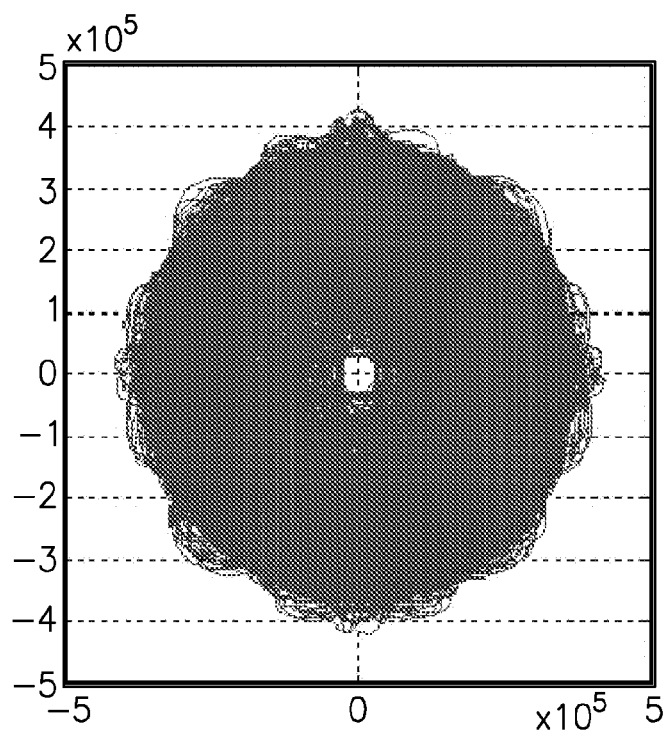

Graphs illustrating the zero-crossing region with and without the use of the modulation bandwidth reduction mechanism of the present invention are shown in FIGS. 23A and 23B. The graph shown in FIG. 23A represents the trajectory before bandwidth reduction, wherein the trajectory passes through the zero-crossing circle. The graph in FIG. 23B shows the trajectory after bandwidth reduction is applied, wherein the zero-crossing region, defined by a circle centered at the origin, is completely avoided.

Figure 24A:
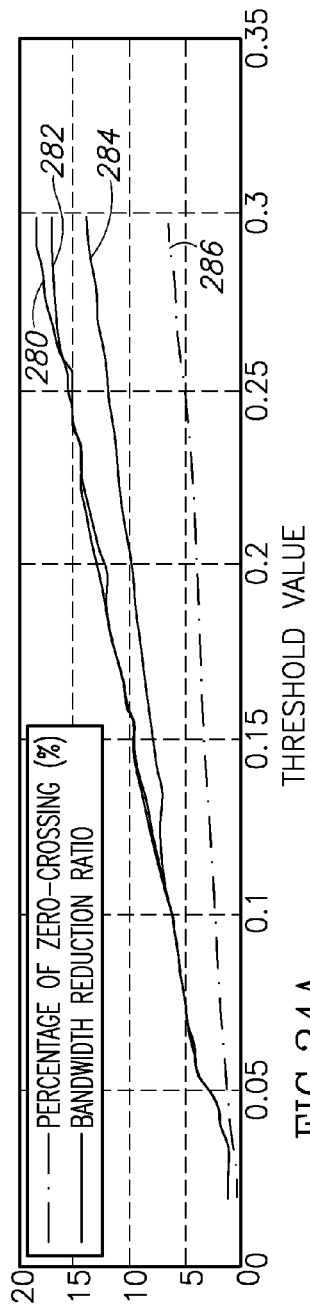
FIGS. 24A, 24B and 24C are graphs depicting a comparison of the three alternative embodiments of the bandwidth reduction mechanism of the invention.
Figure 24B:
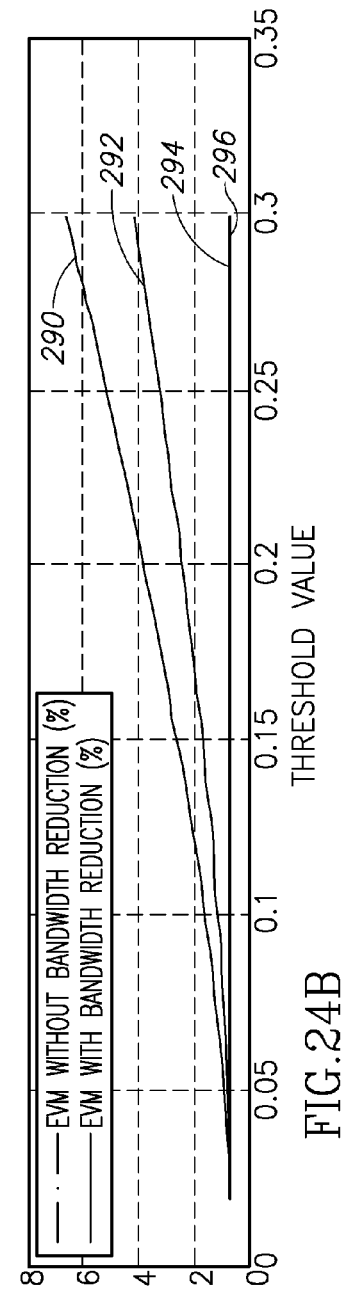
Figure 24C:
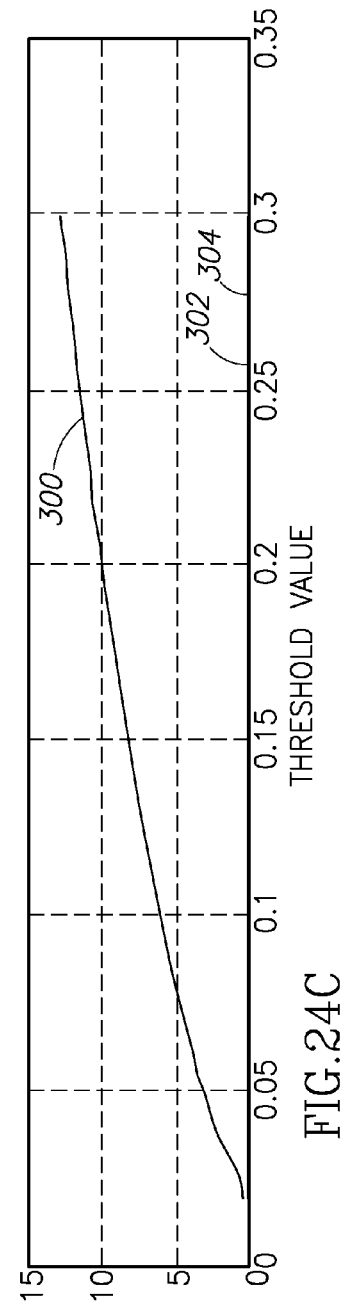

Graphs depicting a comparison of the three alternative embodiments of the bandwidth reduction mechanism of the invention are shown in FIGS. 24A, 24B and 24C. The plot in FIG. 24A shows the ratio of the bandwidth reduction and the percentage of the zero-crossing as a function of threshold value. The dashed trace 286 represents the percentage of zero-crossings and solid traces 282, 284 and 280 represent the bandwidth reduction ratios achieved using methods #1, #2 and #3, respectively.

The plot in FIG. 24B shows the EVM comparison (in percent) versus threshold value. The dashed trace (296) (coincides with trace 294) represents EVM degradation in percent without bandwidth reduction. Solid traces 294, 292, 290 represent EVM degradation in percent with bandwidth reduction achieved using methods #1, #2 and #3, respectively.

The plot in FIG. 24C shows the average spectrum degradation (0~10 MHz) in dB versus threshold value. The solid traces 300, 302, 304 represent the average spectrum degradation achieved using methods #1, #2 and #3, respectively.

It is noted that modifying the trajectory in accordance with the invention impacts the EVM and is visible as modified/reduced amplitude and phase spectra bandwidth. The mechanism, however, does not degrade the modulation spectrum as is visible in minimal to no degradation in the Cartesian I+jQ close in spectrum. This is shown in FIGS. 25, 26, 27.

Figure 25:
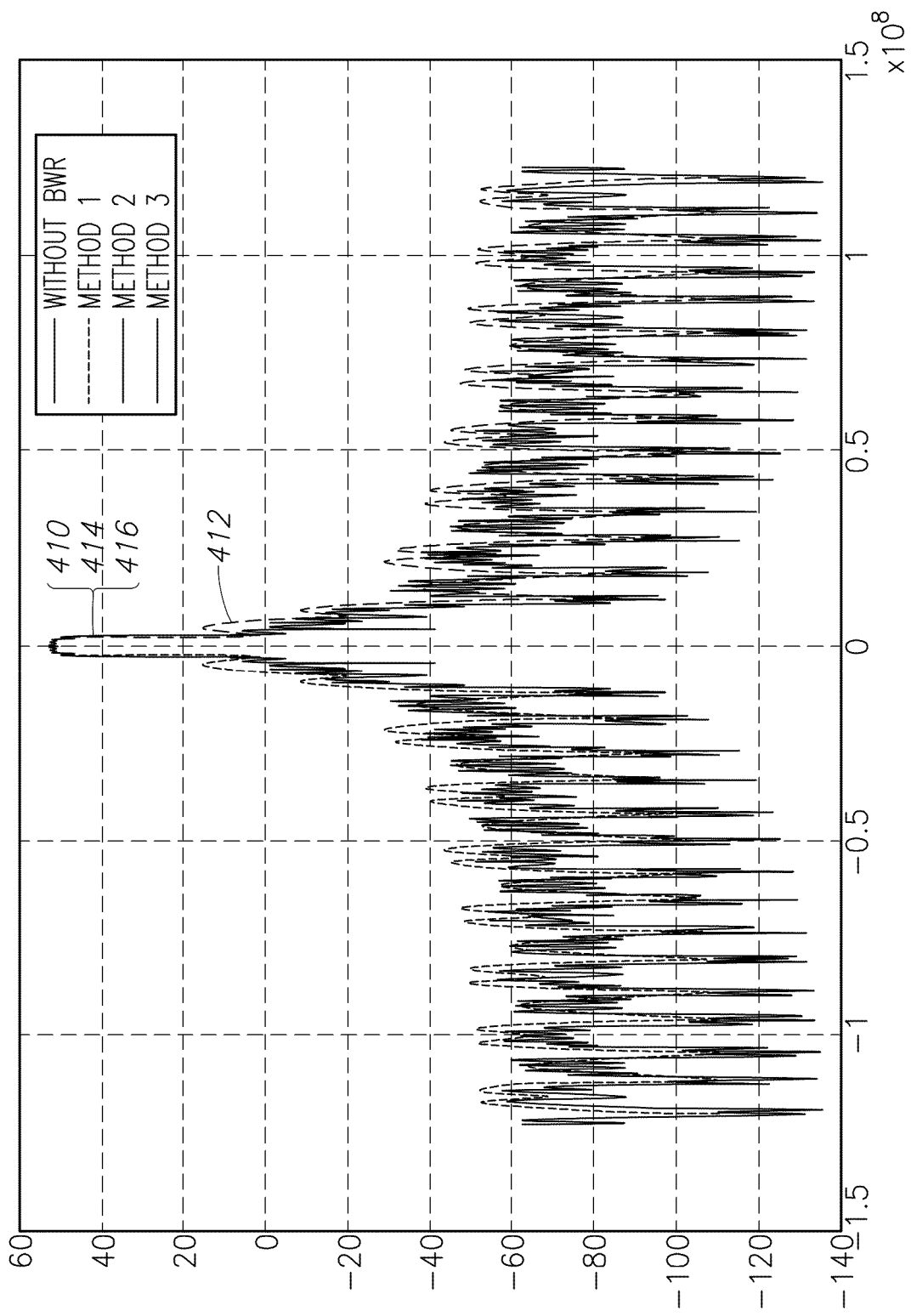
FIG. 25 is a graph illustrating a comparison of the I+jQ power spectral density with and without the three bandwidth reduction methods of the present invention.

A graph illustrating a comparison of the I+jQ power spectral density with and without the three bandwidth reduction methods of the present invention is shown in FIG. 25. Trace 410 (coinciding with traces 414 and 416) represents the power spectral density achieved without bandwidth reduction. Traces 412, 414, 416 represent the power spectral density achieved with bandwidth reduction using methods #1, #2 and #3, respectively. Note that for all three methods, the power spectral density is virtually unchanged from the power spectral density without bandwidth reduction.

It is important to note that although the key motivation of bandwidth reduction mechanism described supra was the reduction of the phase modulation bandwidth, as a consequence, a reduction in the amplitude modulation bandwidth of the polar modulator is also achieved. A key benefit of this is that the reduced amplitude bandwidth can be exploited to potentially relax the sampling and interpolation requirements on the amplitude signal processing path of the polar TX.

Figure 26:
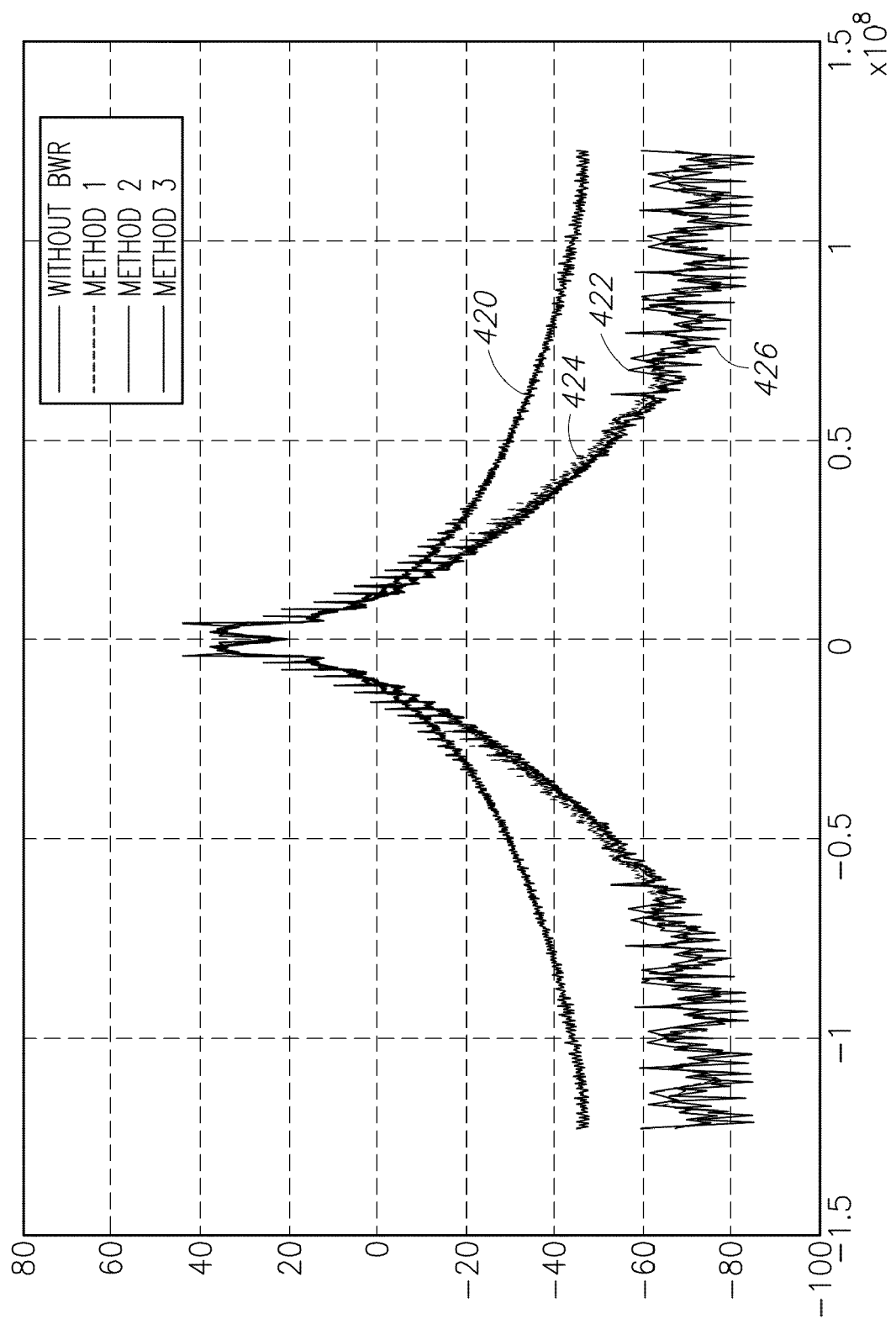
FIG. 26 is a graph illustrating a comparison of the amplitude power spectra with and without the three bandwidth reduction methods of the present invention.
Figure 27:
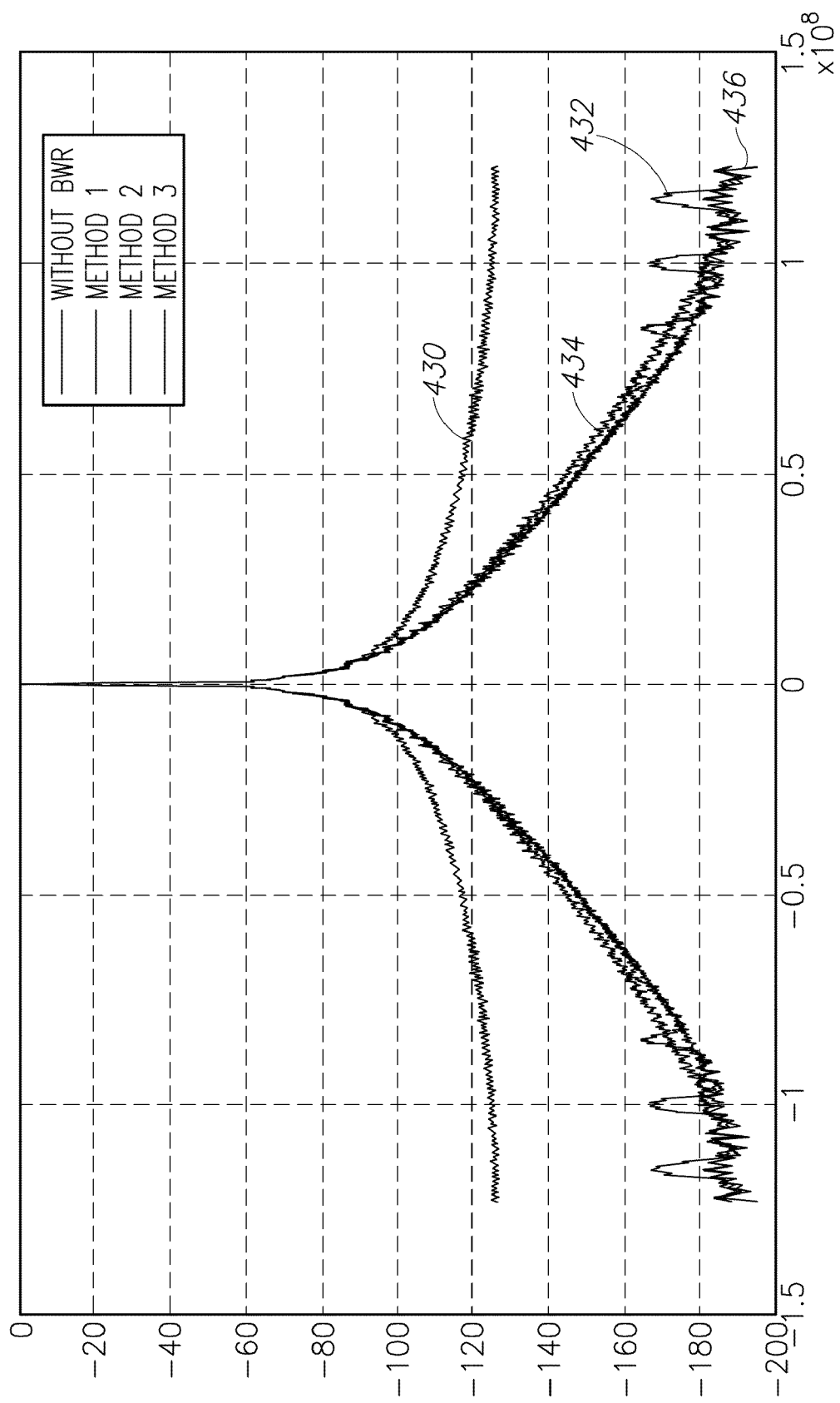
FIG. 27 is a graph illustrating a comparison of the phase power spectra with and without the three bandwidth reduction methods of the present invention.

A graph illustrating a comparison of the amplitude power spectra with and without the three bandwidth reduction methods of the present invention is shown in FIG. 26. Trace 420 represents the amplitude power spectral density without bandwidth reduction. Traces 422, 424, 426 represent the amplitude power spectral density with bandwidth reduction using methods #1, #2 and #3, respectively. Note the significant reduction in bandwidth achieved.

A graph illustrating a comparison of the phase power spectra with and without the three bandwidth reduction methods of the present invention is shown in FIG. 27. Trace 430 represents the phase power spectral density without bandwidth reduction. Traces 432, 434, 436 represent the phase power spectral density with bandwidth reduction using methods #1, #2 and #3, respectively. Note the even higher reduction in bandwidth achieved for the phase.

Quantitative results of the bandwidth reduction mechanism of the present invention for all four methods is presented below in Table 1. For the data presented below, a threshold of 0.15 was used and the percentage of zero crossings was 2.807%. For each method, the bandwidth reduction ratio, EVM with and without the mechanism and the average spectrum degradation is provided.

TABLE 1

Quantitative results of the bandwidth reduction mechanism

| Method | Bandwidth Reduction Ratio | EVM Without BW Reduction (%) | EVM With BW Reduction (%) | Average Spectrum Degradation (dB) |
|---|---|---|---|---|
| 1 | 9.6527 | 1.1623 | 1.1636 | 9.4862 |
| 2 | 8.4201 | 1.1623 | 1.8994 | 0.012454 |
| 3 | 9.6966 | 1.1623 | 2.7021 | 0.0059081 |
| 4 | 9.7063 | 1.1623 | 1.1768 | 1.3182 |

Note further that the application of the bandwidth reduction mechanism of the present invention can be tailored to preserve EVM or spectrum (or to minimize their degradation) using the techniques described supra.

In particular, at the expense of added complexity (and delay) the transmit signal performance features of EVM and spectrum including adjacent channel leakage can be traded off as a function of power level. For example, at higher power levels, the TX may have good spectral properties but poor EVM (due to limited TX linearity). At medium power levels, however, the TX may exhibit good EVM but relatively degraded spectrum. While near minimum power levels, EVM again is limited due to reduced SNR caused by LO leakage, power supply noise, etc. of the TX signal.

As described supra, the offset vector sequence generator 254 (FIG. 15) functions to filter the offset vectors generated by the offset vector calculation block 252. The transfer function of the offset sequence filter implemented in the offset vector sequence generator can be expressed, e.g., as $$y(n) = \sum_{i=1}^{L} b(i)x(n - L + i) \quad (11)$$

where
x(n) is the input;
y(n) is the output;
b(i), i=1, 2 ... L is the offset sequence;
L is the length of the coefficient vector;

The coefficients, b(i), i=1, 2 ... L, for each of the above defined offset vector generation methods are listed below in Table 2, wherein in each case L is the length of the coefficient vector.

TABLE 2

Coefficient Vectors for BWR Methods

| Coefficient # | Method #1 L = 8 | Method #2 L = 13 | Method #3 L = 5 | Method #4 L = 13 |
|---|---|---|---|---|
| 1 | 0.2411 | 0.4917 | 1 | −2.3955 |
| 2 | 0 | 0 | 0 | 0 |
| 3 | −0.9215 | −0.7654 | 0 | 9.8067 |
| 4 | 0.7 | 0 | 0 | 0 |
| 5 | 0.7 | 0.9174 | 1 | −19.7607 |
| 6 | −0.9215 | 0 | 0 | 0 |
| 7 | 0 | 0 | | 24.5810 |
| 8 | 0.2411 | 0 | | 0 |
| 9 | | 0.9174 | | −19.7607 |
| 10 | | 0 | | 0 |
| 11 | | −0.7654 | | 9.8067 |
| 12 | | 0 | | 0 |
| 13 | | 0.4917 | | −2.3955 |

The actual sequence output of the sequence generator 254 is the above sequences scaled by the offset vector output from the offset vector generator 252. The different sequences shown above are a key feature that distinguishes the four bandwidth reduction methods described supra. Note that due to the variable lengths of the BWR offset sequences generation filters, the TX latency will be different for each method.

Figure 28:
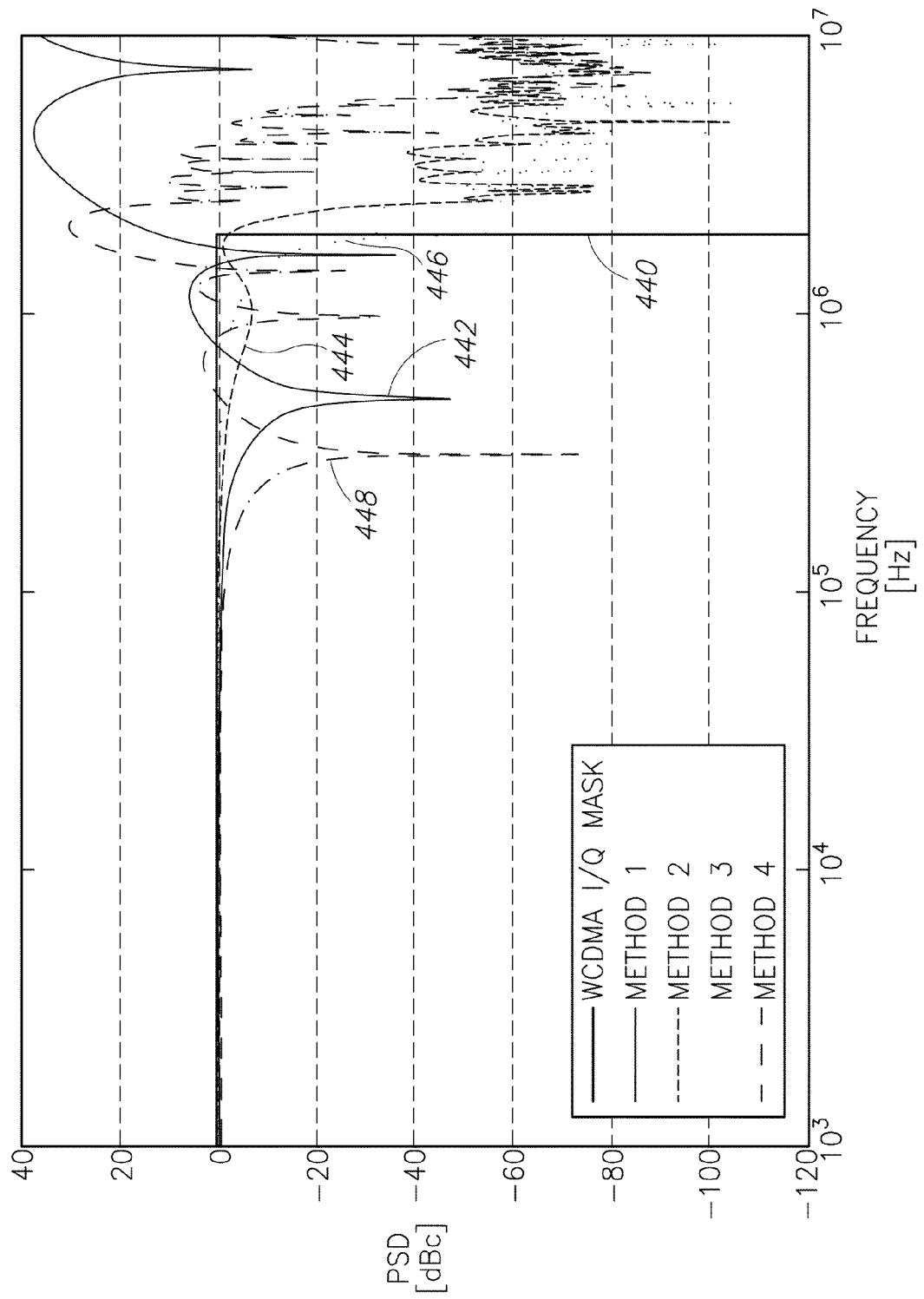
FIG. 28 is a graph illustrating a comparison of the frequency domain transfer function of the offset sequence applied to TX I/Q data paths for four different bandwidth reduction methods.

A graph illustrating a comparison of the frequency domain transfer functions of the offset sequence applied to TX I/Q data paths (i.e. ΔI, ΔQ) for four different bandwidth reduction methods is shown in FIG. 28. In the Figure, the spectral mask (e.g., WCDMA) is represented by the solid trace 440; the transfer function of the offset sequence generated by method #1 is represented by solid trace 442; the transfer function of the offset sequence generated by method #2 is represented by dashed trace 444; the transfer function of the offset sequence generated by method #3 is represented by dotted trace 446; and the transfer function of the offset sequence generated by method #1 is represented by dash/dot trace 448.

Note that method #1 introduces noise at higher frequency offsets causing a degradation of spectrum. Method #2 introduces in-band gain ripple and variable group delay that degrades EVM. Method #3 introduces in-band droop that degrades EVM but has relatively good spectral filtering. Method #4 introduces an in-band null near 300 kHz (similar to method #1 near 400 kHz). EVM, however, is relatively immune to this null. The out of band noise levels of method #4 are worse then those of methods #2 and #3, but better than method #1.

The four bandwidth reduction methods described supra are presented for illustrative purposes only and are not meant to limit the scope of the invention. The example methods have been selected to highlight some of the key design criteria for the process of offset vector generation.

It is important to note that an enhanced offset sequence generation filter (or kernel) can be constructed using the principles of the present invention that applies the offset sequence applied either before or after the RRC filter 228 (FIG. 15) using well-known constrained optimization techniques to arrive at a transfer function which preserves the baseband signal spectrum with minimal EVM degradation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus for reducing polar modulation bandwidth, comprising:
a zero crossing detector operative to determine a complex domain trajectory of input TX IQ data samples and to detect the passing of said complex domain trajectory within a predetermined threshold distance from an origin; and
a path modification circuit operative to modify said complex domain trajectory in response to said detection so as to reduce the modulation bandwidth thereby;
wherein said zero crossing detector comprises:
means for calculating a vector perpendicular to said trajectory;
means for comparing a magnitude of said vector against said predetermined threshold distance; and
means for declaring a zero crossing occurrence if the magnitude of said vector is less than said predetermined threshold distance.

2. An apparatus for reducing polar modulation bandwidth, comprising:
a zero crossing detector operative to determine a complex domain trajectory of input TX IQ data samples and to detect the passing of said complex domain trajectory within a predetermined threshold distance from an origin; and
a path modification circuit operative to modify said complex domain trajectory in response to said detection so as to reduce the modulation bandwidth thereby;
wherein said path modification circuit comprises:
means for calculating an offset vector whose magnitude is the difference between the predetermined threshold distance and the magnitude of a vector perpendicular to said trajectory; and
means for adding said offset vector to said TX IQ data samples thereby reducing the bandwidth of said trajectory.

3. An apparatus for reducing the bandwidth of a polar modulator, comprising:
a filter for generating trajectory sample points;
a zero crossing detector operative to determine a complex domain trajectory of input TX IQ data samples and to detect the passing of said complex domain trajectory within a predetermined threshold distance from an origin; and
an offset vector generator operative to generate an offset vector which, when added to said TX IQ data samples, maintains said complex domain trajectory beyond said predetermined threshold distance from the origin thereby reducing said polar modulation bandwidth.

4. The apparatus according to claim 3, wherein said zero crossing detector comprises:
means for calculating a vector perpendicular to said trajectory;
means for comparing a magnitude of said vector against said predetermined threshold distance; and
means for declaring a zero crossing occurrence if the magnitude of said vector is less than said predetermined threshold distance.

5. The apparatus according to claim 3, wherein said offset vector generator comprises means for calculating said offset vector having a magnitude the difference between the predetermined threshold distance and the magnitude of a vector perpendicular to said trajectory.

6. The apparatus according to claim 3, further comprising a combiner for adding said offset vector to said TX IQ data samples.

7. The apparatus according to claim 3, wherein said offset vector generator is operative to generate an offset vector sequence so as to minimize the degradation of error vector magnitude (EVM) and/or spectrum.

8. The apparatus according to claim 3, wherein said offset vector generator is operative to generate said offset vector in accordance with a desired TX power level.

9. A polar radio frequency (RF) transmitter, comprising:
a bandwidth reduction circuit, comprising:
- a filter for generating trajectory sample points;
- a zero crossing detector operative to determine a complex domain trajectory of input TX IQ data samples and to detect the passing of said complex domain trajectory within a predetermined threshold distance from an origin;
- an offset vector generator operative to generate an offset vector which, when added to said TX IQ data samples, maintains said complex domain trajectory beyond said predetermined threshold distance from the origin thereby reducing said polar modulation bandwidth;
- a combiner for adding said offset vector to said TX IQ data samples to generate modified TX IQ data samples thereby;

means for generating a frequency command and an amplitude command in accordance with said modified TX IQ data samples;

a frequency synthesizer operative to generate an RF signal having a frequency in accordance with a frequency reference input and said frequency command; and a digital power amplifier (DPA) operative to receive said RF signal and to generate a modulated RF output signal in proportion to said amplitude command.

10. The polar transmitter according to claim 9, wherein said zero crossing detector comprises:
- means for calculating a vector perpendicular to said trajectory;
- means for comparing said vector against said predetermined threshold distance; and
- means for declaring a zero crossing occurrence if said vector is less than said predetermined threshold distance.

11. The polar transmitter according to claim 9, wherein said offset vector generator comprises means for calculating said offset vector having a magnitude the difference between the predetermined threshold distance and the magnitude of a vector perpendicular to said trajectory.

12. The polar transmitter according to claim 9, wherein said offset vector generator is operative to generate an offset vector sequence so as to minimize the degradation of error vector magnitude (EVM) and/or spectrum.

13. The polar transmitter according to claim 9, wherein said offset vector generator is operative to generate said offset vector in accordance with a desired TX power level.

* * * * *